US009373667B2

(12) United States Patent
Kawato et al.

(10) Patent No.: US 9,373,667 B2
(45) Date of Patent: Jun. 21, 2016

(54) METHOD FOR MANUFACTURING DISPLAY DEVICE

(71) Applicant: SHARP KABUSHIKI KAISHA, Osaka-shi (JP)

(72) Inventors: Shinichi Kawato, Osaka (JP); Takashi Ochi, Osaka (JP); Yuhki Kobayashi, Osaka (JP); Masahiro Ichihara, Mitsuke (JP); Eiichi Matsumoto, Mitsuke (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 0 days.

(21) Appl. No.: 14/764,534

(22) PCT Filed: Jan. 29, 2014

(86) PCT No.: PCT/JP2014/051993
§ 371 (c)(1),
(2) Date: Jul. 29, 2015

(87) PCT Pub. No.: WO2014/123050
PCT Pub. Date: Aug. 14, 2014

(65) Prior Publication Data
US 2015/0380469 A1 Dec. 31, 2015

(30) Foreign Application Priority Data

Feb. 5, 2013 (JP) ................................. 2013-020891

(51) Int. Cl.
*H01L 27/32* (2006.01)
*H01L 51/00* (2006.01)
(Continued)

(52) U.S. Cl.
CPC ............ *H01L 27/3211* (2013.01); *C23C 14/04* (2013.01); *C23C 14/24* (2013.01);
(Continued)

(58) Field of Classification Search
CPC ......... H01L 27/32; H01L 51/00; H01L 51/56; H01L 51/0001; H01L 51/5012; H01L 51/50; H01L 33/007; H01L 33/0079; H01L 33/32; H01L 31/173; H01L 21/0254; H01L 27/12; H01L 27/1214; H01L 27/1203; H01L 27/3211; H01L 27/1463; H01L 27/14603; H01L 27/14643; H01L 27/14609; H01L 27/14689
USPC ....................... 438/35, 22, 25, 26, 27, 29, 149
See application file for complete search history.

(56) References Cited

U.S. PATENT DOCUMENTS

2011/0266944 A1  11/2011  Song et al.
2012/0183676 A1  7/2012  Sonoda et al.

FOREIGN PATENT DOCUMENTS

JP  2011-233521  11/2011
JP  2012-167309  * 9/2012  .............. H01L 51/50
WO  WO-2011/034011  3/2011

OTHER PUBLICATIONS

International Search Report mailed Apr. 15, 2014, directed to International Application No. PCT/JP2014/051993; 3 pages.
(Continued)

*Primary Examiner* — Chuong A Luu
(74) *Attorney, Agent, or Firm* — Morrison & Foerster LLP

(57) ABSTRACT

The present invention provides a display device which inhibits deterioration in display quality caused by color mixture of luminescent layers. In a case where vapor deposition particles are deposited onto a substrate, $P+2Lc \geq \{(Ts \times M + 0.96 \times G \times Wn)/(Ts-G)\} + 2Dm$ and $3 \, \mu m \leq Dm \leq 5 \, \mu m$ are satisfied, where "M" is a width of a mask opening, "Wn" is a width of an injection hole, "G" is a distance between the TFT substrate and a vapor deposition mask, "Ts" is a distance between the TFT substrate and a vapor deposition source, "P" is a width of a first pixel opening, and "Lc" is a width of a non-display region.

6 Claims, 14 Drawing Sheets

(51) Int. Cl.
  *H01L 51/56* (2006.01)
  *C23C 14/24* (2006.01)
  *C23C 14/04* (2006.01)
  *H01L 51/50* (2006.01)

(52) U.S. Cl.
  CPC ......... *H01L 51/001* (2013.01); *H01L 51/0011* (2013.01); *H01L 51/56* (2013.01); *H01L 51/0008* (2013.01); *H01L 51/5012* (2013.01)

(56) References Cited

OTHER PUBLICATIONS

Written Opinion mailed Apr. 15, 2014, directed to International Application No. PCT/JP2014/051993; 9 pages.

* cited by examiner

SUBSTRATE SCANNING DIRECTION

METHOD FOR MANUFACTURING DISPLAY DEVICE

CROSS REFERENCE TO RELATED APPLICATIONS

This application is a U.S. National Phase patent application of PCT/JP2014/051993, filed on Jan. 29, 2014, which claims priority to Japanese Application No. 2013-020891, filed on Feb. 5, 2013, each of which is hereby incorporated by reference in the present disclosure in its entirety.

FIELD OF THE INVENTION

The present invention relates to a method for manufacturing a display device.

BACKGROUND OF THE INVENTION

In general, a full-color organic EL (electro luminescence) display device includes a substrate on which organic EL elements for colors of red (R), green (G), and blue (B) are arranged as sub-pixels. The organic EL elements are selectively controlled to emit light at an intended luminance with the use of TFTs, and thus an image is displayed on the organic EL display device.

In a process of manufacturing such an organic EL display device, luminescent layers which are made of organic luminescent materials for emitting different colors of light are provided in a pattern for respective organic EL elements which are light-emitting elements. As a method for forming the pattern of the luminescent layers, for example, a vapor deposition method is known in which a vapor deposition mask called shadow mask is used.

Patent Literature 1 discloses a vapor deposition device and a vapor deposition method in each of which a shadow mask is used. FIG. 12 is a plan view illustrating a film formation target substrate and a mask unit which are provided in a vacuum chamber of the vapor deposition device of Patent Literature 1 and are viewed from a film formation target substrate side. FIG. 13 is a cross-sectional view taken along the line B-B in FIG. 12 and schematically illustrating main parts of the vapor deposition device of Patent Literature 1.

As illustrated in FIGS. 12 and 13, a vapor deposition device 250 of Patent Literature 1 includes a vacuum chamber 260, a mask unit 280, and a substrate moving mechanism (not illustrated). The mask unit 280 includes a shadow mask 281 and a vapor deposition source 285 (see FIG. 12).

The shadow mask 281 has a plurality of openings 282. The vapor deposition source 285 separately contains vapor deposition particles which correspond to each color so that a luminescent layer of the corresponding color is formed. Further, the vapor deposition source 285 has a plurality of injection holes 286 through which a vapor deposition material is injected as vapor deposition particles.

As illustrated in FIG. 13, a film formation target substrate 200 is held so that a gap g1 between the film formation target substrate 200 and the shadow mask 281 becomes constant, and the vapor deposition source 285 is provided so as to face the shadow mask 281 via a constant gap g2.

In the vapor deposition device of Patent Literature 1, the film formation target substrate 200 is moved relatively to the mask unit 280 in a direction of the arrow in FIG. 12 such that the vapor deposition particles injected from the plurality of injection holes 286 of the vapor deposition source 285 are sequentially deposited in a vapor deposition region 210 on a vapor deposition surface of the film formation target substrate 200 via the plurality of openings 282 of the shadow mask 281.

Thus, a pattern of vapor-deposited films 211 which correspond to respective sub-pixels is formed in the vapor deposition region 210 of the film formation target substrate 200.
[Patent Literature 1]
Pamphlet of International Publication No. 2011/034011 (Publication date: Mar. 24, 2011)
[Patent Literature 2]
Japanese Patent Application Publication Tokukai No. 2011-233521 (Publication date: Nov. 17, 2011)

SUMMARY OF THE INVENTION

The vapor deposition particles are injected so as to diffuse from each of the plurality of injection holes in a constant range. As illustrated in FIG. 13, (i) each of the plurality of openings 282 has a predetermined width, (ii) the shadow mask 281 and the TFT substrate 290 are apart from each other by the gap g1, and (iii) the vapor deposition source 285 and the shadow mask 281 are apart from each other by the gap g2.

With the configuration, the vapor deposition particles which have been injected from each of the plurality of injection holes and have passed through the opening 282 spread in a space between the shadow mask 281 and the TFT substrate 290 before reaching the TFT substrate 290. From this, a luminescent layer 291 is not formed flatly on the TFT substrate 290 but spreads in a decrescent manner in a range wider than the width of the opening 282.

Therefore, for example, red vapor deposition particles to be injected in a red sub-pixel reach an adjacent green sub-pixel, and accordingly green vapor deposition particles and the red vapor deposition particles are mixed. Hereinafter, a case where one (1) luminescent layer is formed from different colors of vapor deposition particles is referred to as "color mixture".

The luminescent layer having the color mixture causes a problem that light having an intended wavelength is not emitted or light is not emitted through the luminescent layer of a sub-pixel in which the color mixture has occurred. This deteriorates display quality as a display device.

FIG. 14 is a cross-sectional view illustrating one (1) pixel of a light emitting organic display device manufactured by a thin film vapor deposition device of Patent Literature 2.

The light emitting organic display device of Patent Literature 2 includes (i) a first electrode 361 which is connected to a drain electrode 357 of a thin film transistor TFT and to which a positive voltage is supplied, (ii) a second electrode 363 which is provided so as to cover the entire pixel and to which a negative voltage is supplied, and an organic layer 362 which is provided between the first electrode 361 and the second electrode 363 and emits light. The organic layer 362 includes luminescent layers 362R, 362G, and 362B and auxiliary layers 362R' and 362G'.

Moreover, in the organic layer 362, one end part of the blue luminescent layer 362B overlaps with one end part of the green auxiliary layer 362G' and one end part of the green luminescent layer 362G, and the other end part of the green luminescent layer 362G overlaps with one end part of the red auxiliary layer 362W and one end part of the red luminescent layer 362R.

With the arrangement, the green auxiliary layer 362G' is located between the blue luminescent layer 362B and the green luminescent layer 362G so that the blue luminescent layer 362B and the green luminescent layer 362G which are adjacent to each other do not directly make contact with each other. Moreover, the red auxiliary layer 362R' is located between the green luminescent layer 362G and the red luminescent layer 362R so that the green luminescent layer G and the red luminescent layer R which are adjacent to each other do not directly make contact with each other.

Patent Literature 2 discloses that the above configuration (i) greatly improves light emission efficiency of the luminescent layer, (ii) inhibits a color mixture phenomenon, and (iii) brings about an effect of improving color coordinates.

However, in a case where the auxiliary layer is inserted between colors as in the light emitting organic display device of Patent Literature 2, there is a problem that the number of processes to form the organic layer is increased, and thus productivity is extremely deteriorated.

The present invention is accomplished in view of the problems, and its object is to provide (i) a display device which can inhibit decrease in display quality caused by color mixture in a luminescent layer, without deteriorating productivity and (ii) a method for manufacturing the display device.

The inventors analyzed a shape of a luminescent layer formed by vapor deposition with the use of a mask. As a result, the inventors have found that, in a cross sectional shape of the luminescent layer, an area which has a decrescent film thickness includes two regions. The two regions are (i) a theoretical tapering region (theoretical tapering section) in which the film thickness becomes smaller in proportion to a distance from a center of the luminescent layer in a plan view based on a geometrical structure of the vapor deposition device and (ii) a measured tapering region (measured tapering section) which is on an outer side of the theoretical tapering region and in which the film thickness becomes smaller in a curved manner in accordance with a distance from the center of the luminescent layer.

The measured tapering section lies on the outer side of the theoretical tapering section and therefore, in a case where a film thickness is calculated based on a geometrical structure of the vapor deposition device and vapor deposition is carried out, the measured tapering section of the luminescent layer may reach other pixels. In such a case, color mixture is caused.

The inventors observed the shape of the luminescent layer in the measured tapering section and confirmed, as the display device, that the film thickness is sufficiently small at a location that is 3 µm outer side of a boundary between the theoretical tapering section and the measured tapering section, and therefore the luminescent layer at the location hardly influences a light-emitting characteristic even if the luminescent layer reaches the adjacent pixel.

By taking into consideration the above analysis result, the inventors have found the method for manufacturing the display device which includes a luminescent layer and does not deteriorates display quality.

In order to attain the object, a method for manufacturing a display device in accordance with an aspect of the present invention is a method for manufacturing a display device including a substrate on which a plurality of pixel openings and a non-display region are defined, the plurality of pixel openings being respective regions from which light is emitted, and the non-display region being a region which is located between any adjacent ones of the plurality of pixel openings and from which no light is emitted, a plural kinds of luminescent layers for emitting different colors of lights being provided on the substrate for the respective plurality of pixel openings, the method including the step of: depositing the plural kinds of luminescent layers on the substrate at respective locations corresponding to the plurality of pixel openings by (i) providing the substrate, a vapor deposition mask having a mask opening, and a vapor deposition source having an injection hole from which vapor deposition particles are injected, in this order and (ii) depositing the vapor deposition particles onto the substrate via the mask opening, in a case where the vapor deposition particles are deposited onto the substrate in the luminescent layer depositing step so as to form (i) a first luminescent layer which corresponds to a first pixel opening that is one of the plurality of pixel openings and (ii) a second luminescent layer which (a) corresponds to a second pixel opening that is adjacent to the first pixel opening via the non-display region and (b) emits light whose color is different from a color of light emitted by the first luminescent layer, the following formulae being satisfied: $P+2Lc \geq \{(Ts \times M+0.96 \times G \times Wn)/(Ts-G)\}+2Dm$ and $3 \text{ µm } Dm \leq 5 \text{ µm}$ where "M" is a width of the mask opening, "Wn" is a width of the injection hole, "G" is a distance between the substrate and the vapor deposition mask, "Ts" is a distance between the substrate and the vapor deposition source, "P" is a width of the first pixel opening, and "Lc" is a width of the non-display region.

According to an aspect of the present invention, it is possible to provide (i) a display device which can inhibit decrease in display quality caused by color mixture in a luminescent layer, without deteriorating productivity and (ii) a method for manufacturing the display device.

DESCRIPTION OF THE INVENTION

The following description will discuss details of an embodiment of the present invention, with reference to FIGS. 1 through 9.

As an example of a display device of the present embodiment, an organic EL display device is described which is of an RGB full-color display type and is of a bottom emission type in which light is extracted from a TFT substrate side.

The following description will discuss an overall configuration of the organic EL display device 1.

Figure 1:
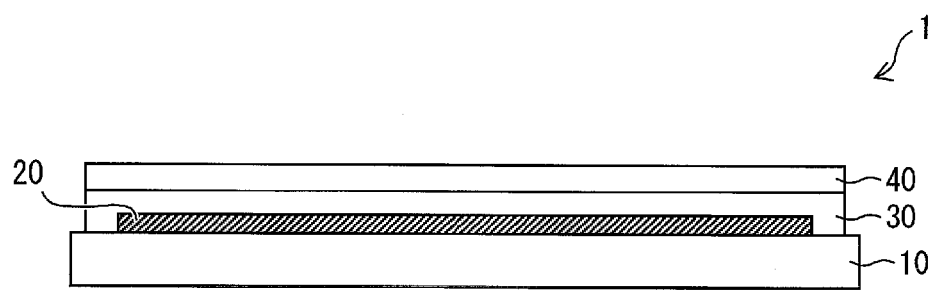
FIG. 1 is a cross-sectional view schematically illustrating a configuration of an organic EL display device that is of RGB full-color display, in accordance with Embodiment 1 of the present invention.
Figure 2:
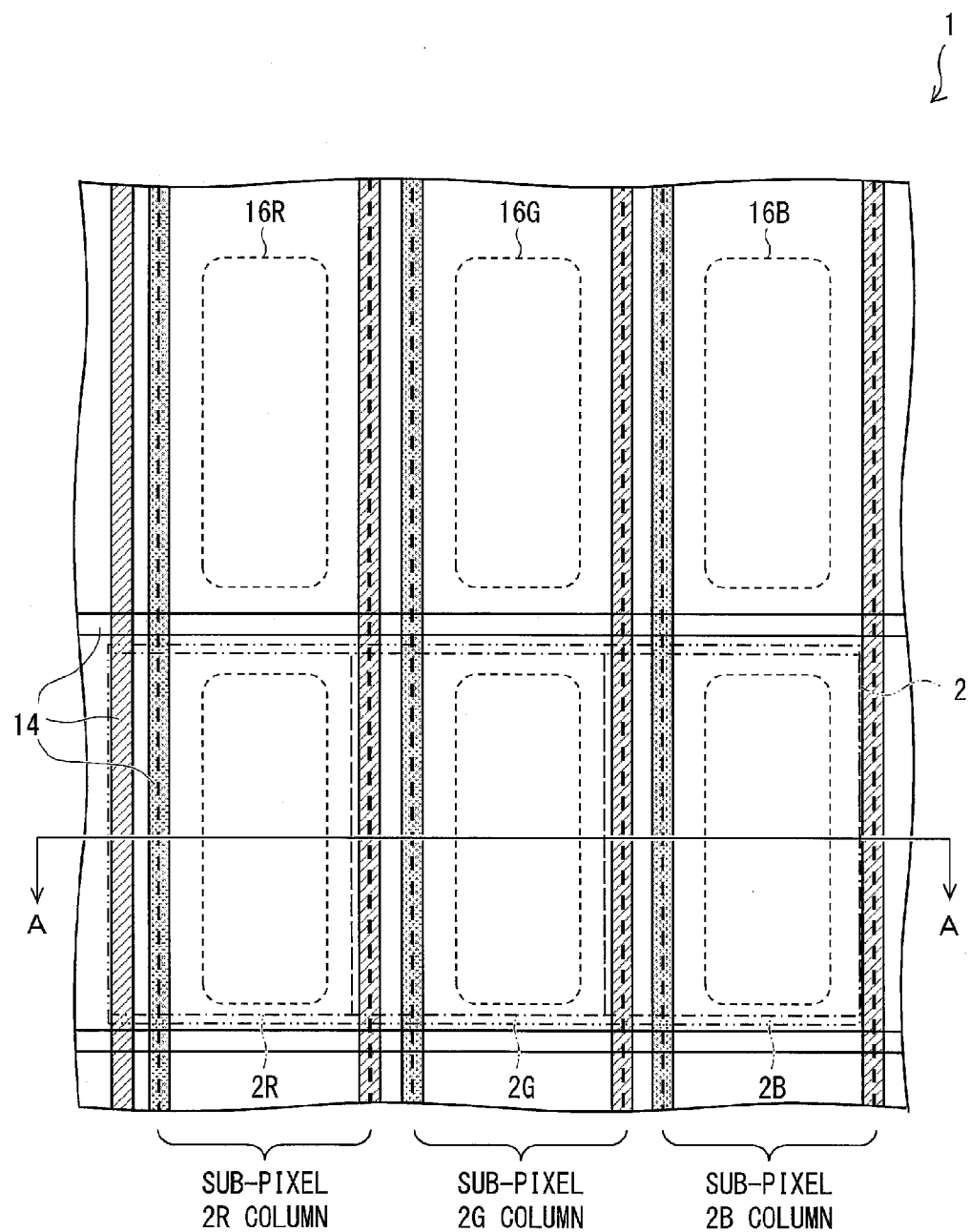
FIG. 2 is a plan view illustrating a configuration of a pixel included in the organic EL display device, in accordance with Embodiment 1 of the present invention.
Figure 3:
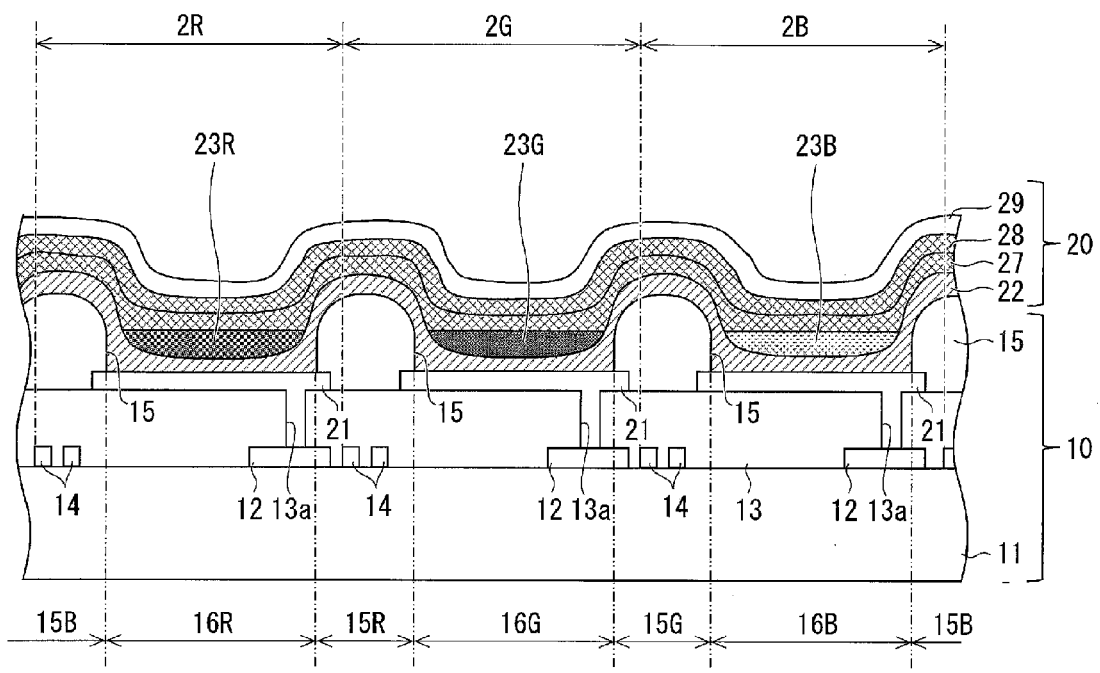
FIG. 3 is a cross-sectional view taken along the line A-A of FIG. 2 and illustrating a TFT substrate in the organic EL display device, in accordance with Embodiment 1 of the present invention.

FIG. 1 is a cross-sectional view schematically illustrating a configuration of an organic EL display device that is of RGB full-color display, in accordance with the present embodiment. FIG. 2 is a plan view illustrating a configuration of a pixel included in the organic EL display device illustrated in FIG. 1. FIG. 3 is a cross-sectional view taken along the line A-A of FIG. 2 and illustrating a TFT substrate and an organic EL element which are cut in a direction in which sub-pixels 2R, 2G, and 2B are arranged in the organic EL display device illustrated in FIG. 2.

As illustrated in FIG. 1, the organic EL display device 1 of the present embodiment has a configuration in which an organic EL element 20, an adhesive layer 30, and a sealing substrate 40 are stacked in this order on a TFT substrate 10.

As illustrated in FIG. 1, the organic EL element 20 is sealed between two substrates (i.e., the TFT substrate 10 and the sealing substrate 40) by bonding the TFT substrate 10, on which the organic EL element 20 has been stacked, to the sealing substrate 40 with the use of the adhesive layer 30.

As such, the organic EL element 20 is sealed between the TFT substrate 10 and the sealing substrate 40, and therefore the organic EL display device 1 can prevent oxygen and moisture from externally entering the organic EL element 20.

As illustrated in FIG. 3, the TFT substrate 10 has a configuration in which a TFT 12 (switching element), an interlayer film 13 (interlayer insulating film, planarizing film), wires 14, a first electrode 21, and an edge cover 15 are provided in this order on the insulating substrate 11.

As illustrated in FIG. 2, a plurality of wires 14 are provided on the insulating substrate 11. The plurality of wires 14 include (i) a plurality of gate lines which extend in a horizontal direction and (ii) a plurality of signal lines which extend in a vertical direction and intersect with the plurality of gate lines. The plurality of gate lines are connected with a gate line driving circuit (not illustrated) for driving the plurality of gate lines, and the plurality of signal lines are connected with a signal line driving circuit (not illustrated) for driving the plurality of signal lines.

The organic EL display device 1 is a full-color active matrix organic EL display device. In the organic EL display device 1, sub-pixels 2R, 2G, and 2B for respectively emitting red (R) light, green (G) light, and blue (B) light are provided, in a matrix manner, in respective regions surrounded by the plurality of wires 14 in a plan view.

That is, one (1) sub-pixel (dot) is defined for each of intersections of the plurality of wires 14, and each of the sub-pixels is defined by any of luminescent regions of R, G, and B.

A pixel 2 (i.e., one (1) pixel) is configured by sub-pixels 2R, 2G, and 2B. The sub-pixel 2R is provided for emitting red light, the sub-pixel 2G is provided for emitting green light, and the sub-pixel 2B is provided for emitting blue light.

On the TFT substrate 10, pixel openings 16R, 16G, and 16B are defined which correspond to the respective sub-pixels 2R, 2G, and 2B and via which different colors of light are emitted. In the pixel openings 16R, 16G, and 16B, luminescent layers 23R, 23G, and 23B are respectively provided so that different colors of light are to be emitted from the respective sub-pixels 2R, 2G, and 2B.

In the description below, the organic EL display device 1 will be discussed which includes the red luminescent layer 23R, the green luminescent layer 23G, and the blue luminescent layer 23B as luminescent layers. Note, however, that the types of the luminescent layers are not limited to three, provided that plural types of luminescent layers are provided.

The luminescent layers 23R, 23G, and 23B are formed as a pattern by vapor deposition for respective colors of light to be emitted. Note that the pixel openings 16R, 16G, and 16B will be described later.

For each of the sub-pixels 2R, 2G, and 2B, a first electrode 21 and a TFT 12 connected with the first electrode 21 are provided. Intensity of light emitted from each of the sub-pixels 2R, 2G, and 2B is determined by scanning and selection with the use of the wires 14 and the TFT 12. As such, in the organic EL display device 1, the organic EL element 20 is controlled to selectively emit light at an intended luminance with the use of the TFT 12, and thus an image is displayed.

The interlayer film 13 is stacked on the insulating substrate 11 in an entire are of the insulating substrate 11 so as to cover the TFTs 12.

The interlayer film 13 has a contact hole 13a via which the first electrode 21 is electrically connected to the TFT 12.

The first electrode 21 is a layer having a function to inject (supply) positive holes to an organic EL layer (later described). As above described, the first electrode 21 is connected with the TFT 12 via the contact hole 13a.

The edge cover 15 is an insulating layer for preventing short circuit between the first electrode 21 and the second electrode 29 in the organic EL element 20 which is caused when the organic EL layer becomes thin in a pattern end part of the first electrode 21 or when electric fields are concentrated.

The edge cover 15 is provided on the interlayer film 13 so as to cover an end part of the first electrode 21.

In each of the sub-pixels 2R, 2G, and 2B, a part of the first electrode 21 which part is not covered with the edge cover 15 serves as the luminescent region from which light is to be emitted.

That is, in the plan view, the pixel openings 16R, 16G, and 16B are defined by parts in which (i) the first electrodes 21 are provided on the TFT substrate 10 and (ii) the first electrodes 21 are exposed without being covered with the edge cover 15.

Meanwhile, in the plan view, regions on the TFT substrate 10 in which regions the edge cover 15 is provided are respective non-display regions 15R, 15G, and 15B from which no light is to be emitted.

The organic EL element 20 is a light-emitting element which can emit light at a high luminance by low-voltage direct current driving. The organic EL element 20 is made up of the first electrode 21, an organic EL layer, and the second electrode 29. The organic EL layer and the second electrode 29 are stacked on the first electrode 21 in this order.

As illustrated in FIG. 3, the organic EL layer can have a configuration in which, from a first electrode 21 side, a hole injection layer/hole transfer layer 22, luminescent layers 23R, 23G, and 23B, an electron transfer layer 27, and an electron injection layer 28 are provided in this order.

Note that the stacking order is of a case where the first electrode 21 serves as an anode and the second electrode 29 serves as a cathode. In a case where the first electrode 21 serves as a cathode and the second electrode 29 serves as an anode, the stacking order in the organic EL layer is reversed.

The hole injection layer/hole transfer layer 22 is uniformly provided in an entire display area of the TFT substrate 10 so as to cover the first electrode 21 and the edge cover 15.

The luminescent layers 23R, 23G, and 23B are provided on the hole injection layer/hole transfer layer 22 for the respective sub-pixels 2R, 2G, and 2B so as to cover the respective pixel openings 16R, 16G, and 16B.

Each of the luminescent layers 23R, 23G, and 23B is a layer that has a function to emit light by recombining holes (i.e., positive holes) injected from a first electrode 21 side with electrons injected from a second electrode 29 side.

The electron transfer layer 27 is a layer having a function to enhance efficiency in transferring electrons from the second electrode 29 to the luminescent layers 23R, 23G, and 23B. The electron injection layer 28 is a layer having a function to enhance efficiency in injecting electrons from the second electrode 29 to the luminescent layers 23R, 23G, and 23B.

The electron transfer layer 27 is uniformly provided in the entire display area of the TFT substrate 10 on the luminescent layers 23R, 23G, and 23B and the hole injection layer/hole transfer layer 22 so as to cover the luminescent layers 23R, 23G, and 23B and the hole injection layer/hole transfer layer 22. The electron injection layer 28 is uniformly provided in the entire display area of the TFT substrate 10 on the electron transfer layer 27 so as to cover the electron transfer layer 27.

The second electrode 29 is a layer having a function to inject electrons to the organic EL layer configured by the organic layer as above described. The second electrode 29 is uniformly provided in the entire display area of the TFT substrate 10 on the electron injection layer 28 so as to cover the electron injection layer 28.

The organic layers other than the luminescent layers 23R, 23G, and 23B are not essential layers as the organic EL layer and can be provided as appropriate in accordance with a requested characteristic of the organic EL element 20.

As a configuration of the organic EL element 20, for example, any of layer configurations (1) through (8) below can be employed:
(1) luminescent layer/second electrode
(2) hole transfer layer/luminescent layer/electron transfer layer/second electrode
(3) hole transfer layer/luminescent layer/hole blocking layer/ electron transfer layer/second electrode
(4) hole transfer layer/luminescent layer/hole blocking layer/ electron transfer layer/electron injection layer/second electrode
(5) hole injection layer/hole transfer layer/luminescent layer/ electron transfer layer/electron injection layer/second electrode
(6) hole injection layer/hole transfer layer/luminescent layer/ hole blocking layer/electron transfer layer/second electrode
(7) hole injection layer/hole transfer layer/luminescent layer/ hole blocking layer/electron transfer layer/electron injection layer/second electrode
(8) hole injection layer/hole transfer layer/electron blocking layer (carrier blocking layer)/luminescent layer/hole blocking layer/electron transfer layer/electron injection layer/second electrode The configuration of the organic EL element 20 is not limited to the above exemplified layer configurations, and an intended layer configuration can be employed in accordance with a request characteristic of the organic EL element 20.

Figure 4:
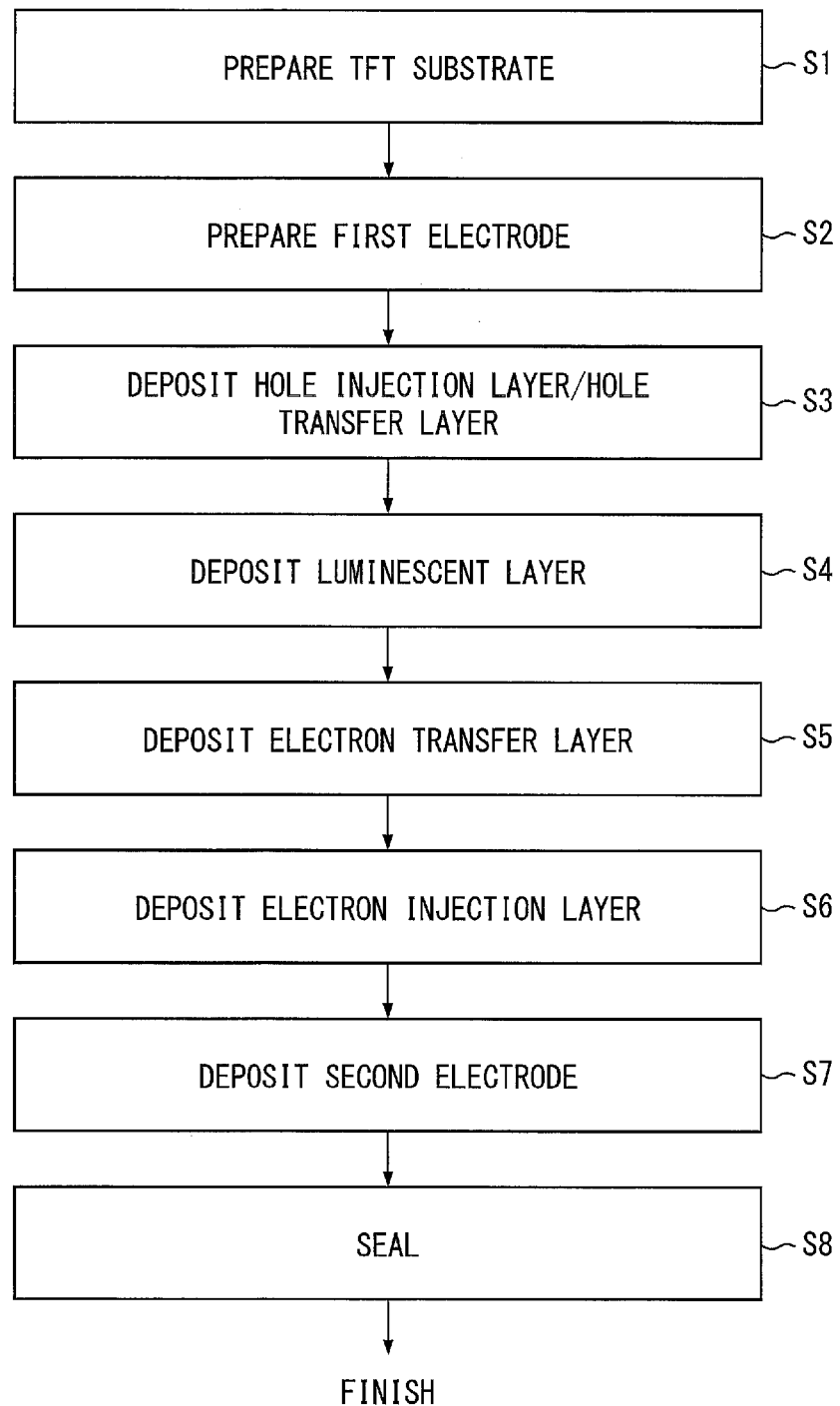
FIG. 4 is a flowchart sequentially illustrating processes for manufacturing the organic EL display device.

FIG. 4 is a flowchart illustrating sequential processes for manufacturing the organic EL display device.

As illustrated in FIG. 4, a method for manufacturing the organic EL display device 1 in accordance with the present embodiment includes, for example, a TFT substrate preparing step (S1), a first electrode preparing step (S2), a hole injection layer/hole transfer layer depositing configuration (S3), a luminescent layer depositing step (S4), an electron transfer layer depositing step (S5), an electron injection layer depositing step (S6), a second electrode depositing step (S7), and a sealing step (S8).

In the luminescent layer depositing step (S4), the luminescent layers 23R, 23G, and 23B are formed on the hole injection layer/hole transfer layer 22 for the respective sub-pixels 2R, 2G, and 2B by selective application (pattern formation) so as to cover the respective pixel openings 16R, 16G, and 16B.

The following description will discuss a method for forming the luminescent layers 23R, 23G, and 23B by selective application, in accordance with the present embodiment.

In the luminescent layer depositing step (S4) included in the method for manufacturing the organic EL display device 1 of the present embodiment, the luminescent layers 23R, 23G, and 23B can be deposited on the TFT substrate 10 with the use of a vapor deposition mask.

Figure 5:
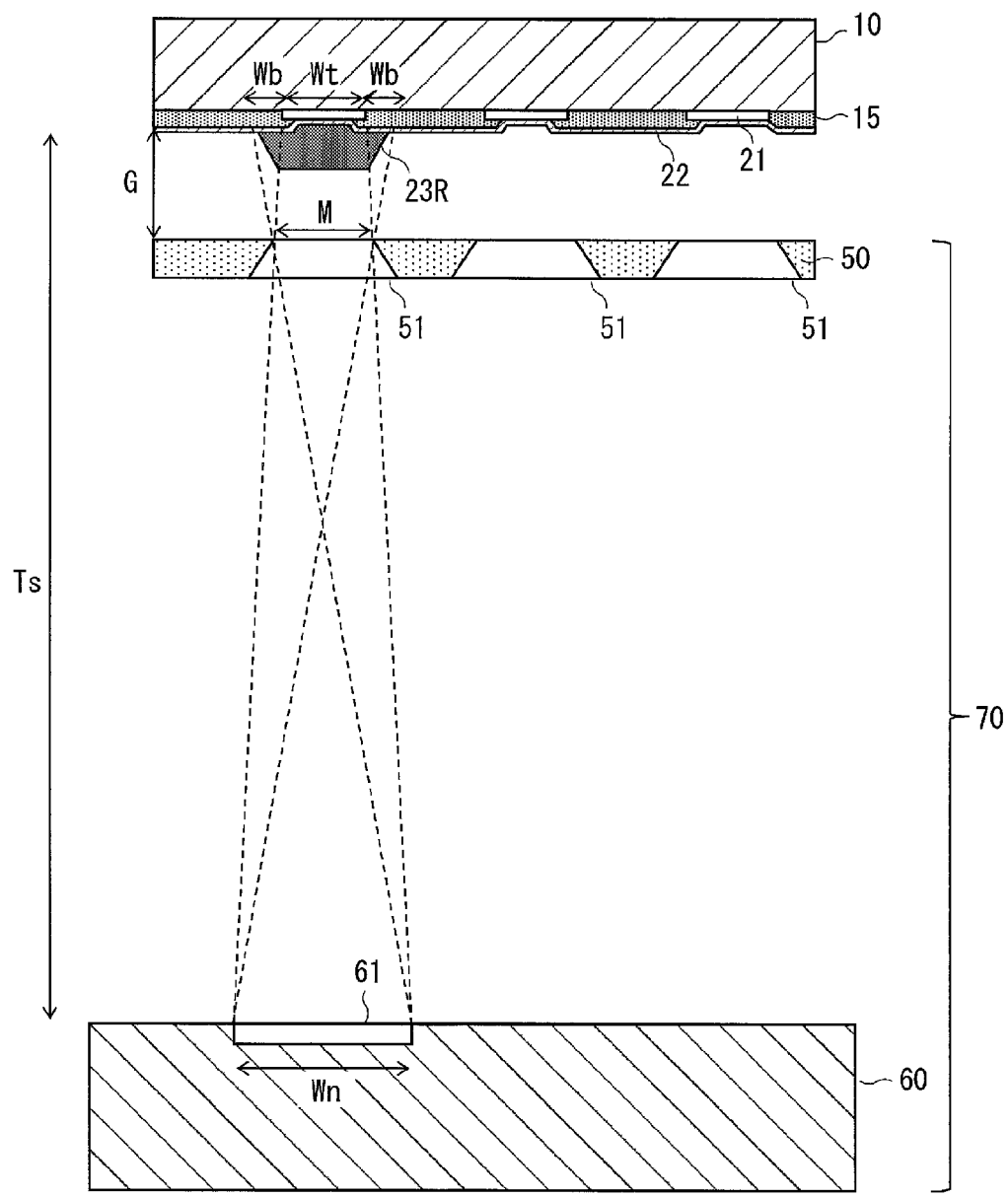
FIG. 5 is a cross-sectional view of a TFT substrate and a vapor deposition device, which view is for explaining a process of forming a luminescent layer on the TFT substrate with the use of the vapor deposition device.

FIG. 5 is a cross-sectional view of a TFT substrate and a vapor deposition device, which view is for explaining a process of forming a luminescent layer on the TFT substrate with the use of the vapor deposition device. FIG. 5 is a view illustrating a process of forming the luminescent layer 23R on the hole injection layer/hole transfer layer 22. Note that FIG. 5 is a view mainly for explaining a positional relation between the vapor deposition device and the TFT substrate in the luminescent layer depositing step of the present embodiment, and a thickness and a shape of the luminescent layer are simplified in FIG. 5 for explanation.

As illustrated in FIG. 5, a vapor deposition device 70 includes a vapor deposition source 60 and a vapor deposition mask 50, and the vapor deposition mask 50 is provided so as to face the TFT substrate 10. The luminescent layers 23R, 23G, and 23B in the organic EL display device 1 of the present embodiment are formed by depositing vapor deposition particles, which are injected from the vapor deposition source 60, onto the TFT substrate 10.

The vapor deposition mask 50 which has a mask opening 51 is provided between the TFT substrate 10 and the vapor deposition source 60. The vapor deposition particles are deposited onto the TFT substrate 10 via the mask opening 51.

The vapor deposition source 60 has, for example, a mechanism for injecting vapor deposition particles upward. The vapor deposition source 60 has a plurality of vapor deposition source openings 61 (injection hole) on a surface facing the vapor deposition mask 50. The plurality of vapor deposition source openings 61 are provided for injecting (scattering) the vapor deposition material as vapor deposition particles. The vapor deposition particles are injected from the vapor deposition source openings 61 with certain isotropy.

A width of the vapor deposition source opening 61 of the vapor deposition source 60 is assumed to be "Wn", and a width of the mask opening 51 of the vapor deposition mask 50 is assumed to be "M". Note that the width M of the mask opening 51 is a width, in the plan view, of a through hole provided in the vapor deposition mask 50.

Moreover, a distance between the vapor deposition source 60 and the TFT substrate 10 is assumed to be "Ts", and a distance between the vapor deposition mask 50 and the TFT substrate 10 is assumed to be "G".

In the luminescent layer depositing step, it is preferable that vapor deposition is carried out in a state in which a center of the vapor deposition source opening 61, a center of the mask opening 51, and each of centers of the respective pixel openings 16R, 16G, and 16B are arranged on one straight line.

In a case where a method is employed in which a luminescent layer is formed on the TFT substrate 10 by (i) moving the TFT substrate 10 relatively to the vapor deposition mask 50 and (ii) sequentially depositing vapor deposition particles via the mask opening 51 onto vapor deposition regions on the vapor deposition surface of the TFT substrate 10 as in the invention disclosed in Patent Literature 1, it is necessary to provide a certain gap between the TFT substrate 10 and the vapor deposition mask 50.

In a case where a certain gap G is provided between the TFT substrate 10 and the vapor deposition mask 50 as above described, the TFT substrate 10 is to, in the plan view, have (i) a region in which vapor deposition particles injected from the entire vapor deposition source opening 61 are deposited (i.e., a region having a width of "Wt" in FIG. 5) and (ii) a region in which vapor deposition particles injected from a part of the vapor deposition source opening 61 are deposited (i.e., a region having a width of "Wb" in FIG. 5).

In the region of the TFT substrate 10 in which region vapor deposition particles injected from the entire vapor deposition source opening 61 are deposited, the vapor deposition particles are uniformly deposited, and therefore the luminescent layers 23R, 23G, and 23B are to have a substantially uniform film thickness in the region.

As such, each of the luminescent layers 23R, 23G, and 23B is to have a part (i) in which a film thickness is uniform and (ii) which has a flat cross sectional shape. Hereinafter, this part is referred to as a flat section of each of the luminescent layers 23R, 23G, and 23B.

Meanwhile, in the region of the TFT substrate 10 in which region vapor deposition particles injected from a part of the vapor deposition source opening 61 are deposited, the vapor deposition particles are not uniformly deposited, and a film thickness of each of the luminescent layers 23R, 23G, and 23B becomes smaller in accordance with a distance from a center of each of the luminescent layers 23R, 23G, and 23B in the plan view.

As such a part is formed (i) in which a film thickness varies depending on a location on the TFT substrate 10 and (ii) whose cross sectional shape is not flat. Hereinafter, this part is referred to as a tapering section of each of the luminescent layers 23R, 23G, and 23B.

In a case where the tapering sections of the respective luminescent layers 23R, 23G, and 23B reach the pixel openings 16R, 16G, and 16B of the adjacent sub-pixels 2R, 2G, and 2B and luminescent layers 23R, 23G, and 23B for emitting different colors of light are formed in one of the pixel openings 16R, 16G, and 16B, that is, color mixture is caused, light is to be emitted in a color other than an intended color or light is not emitted.

Therefore, in a case where color mixture is caused in the pixel openings 16R, 16G, and 16B, display quality of the display device is deteriorated.

Figure 6:
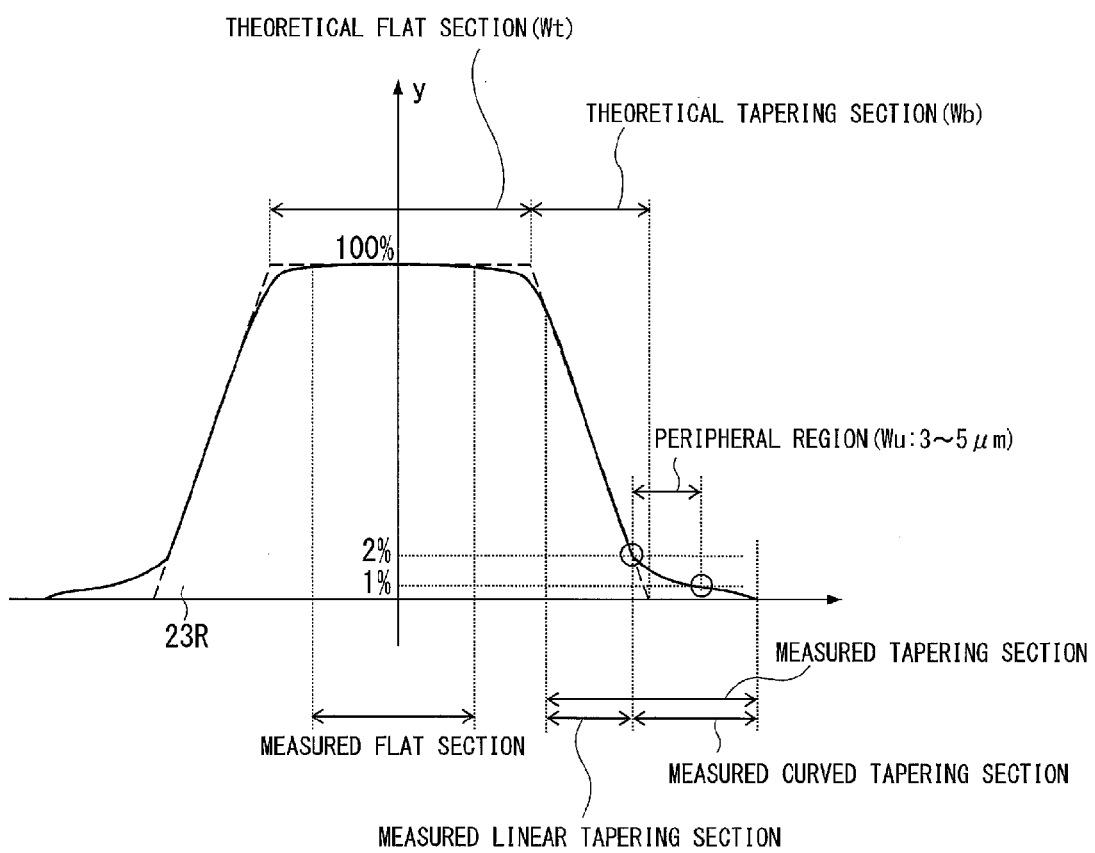
FIG. 6 is a cross-sectional view taken in a direction perpendicular to a TFT substrate and illustrating a luminescent layer deposited on the TFT substrate in a luminescent layer depositing step.

FIG. 6 is a cross-sectional view taken in a direction perpendicular to a TFT substrate and illustrating a luminescent layer deposited on the TFT substrate in the luminescent layer depositing step.

In FIG. 6, the luminescent layer 23R is illustrated for explanation, and the same explanation applies to the luminescent layers 23G and 23B.

A film thickness and a shape of the luminescent layer 23R can be theoretically calculated from the distance Ts between the vapor deposition source 60 and the TFT substrate 10, the distance G between the vapor deposition mask 50 and the TFT substrate 10, the width Wn of the vapor deposition source opening 61, and the width M of the mask opening 51.

In FIG. 6, a theoretically-obtained cross sectional shape of the luminescent layer 23R is depicted by dotted lines.

According to the theoretically-obtained cross sectional shape of the luminescent layer 23R, the luminescent layer 23R includes (i) a flat section (hereinafter, referred to as "theoretical flat section") which has a constant film thickness and (ii) a tapering section (hereinafter, referred to as "theoretical tapering section") which lies around the theoretical flat section and has a film thickness that becomes smaller in proportion to a distance from a central axis y of the luminescent layer 23R.

A width Wt of the theoretical flat section is represented as follows:

$$Wt=\{(Ts \times M)/(Ts-G)\}-Wb$$

Moreover, Ts>>G is true in a vapor deposition method in which a normal vapor deposition device is used, and therefore the width Wt is approximated as follows:

$$Wt=M-Wb$$

A width Wb of the theoretical tapering section is represented as follows:

$$Wb=(G \times Wn)/(Ts-G)$$

Ts>>G is true, and therefore the width Wb is approximated as follows:

$$Wb=(G \times Wn)/Ts$$

However, a shape of the luminescent layer 23R which has been actually formed on the TFT substrate 10 is different from the theoretically obtained shape. Moreover, it was not easy to actually measure the shape, and therefore the existence of the luminescent layer 23R was sometimes not identified.

The inventors have succeeded in accurately measuring the film thickness of the luminescent layers 23R, 23G, and 23B by the use of (i) measuring means including an accurate level-difference meter and TOF-SIMS (Time of Flight Secondary Ion Mass Spectroscopy) and (ii) a calibration sample. Note that, as the TOF-SIMS, TOF-SIMS IV manufactured by IONTOF was used.

In FIG. 6, solid lines depict a cross sectional shape of the luminescent layer 23R which has been obtained by actually measuring the film thickness.

By the film thickness measurement (cross sectional shape measurement) carried out by the inventors of the present invention with respect to the luminescent layer 23R, it has been found that the luminescent layer 23R includes a flat section (hereinafter, referred to as "measured flat section") having a constant film thickness and a tapering section (hereinafter, referred to as "measured tapering section") having a film thickness that becomes smaller in proportion to a distance from the central axis y of the luminescent layer 23R. Further, it has been found that a boundary between the measured flat section and the measured tapering section has a gentle round shape, and a width of the measured flat section is smaller than a width of the theoretical flat section in the plan view.

Moreover, verification by the inventors of the present invention showed that the measured tapering section has, in the plan view, (i) a measured linear tapering section (linear tapering section) having a film thickness that is linearly decreased in proportion to a distance from the central axis y of the luminescent layer and (ii) a measured curved tapering section (curved tapering section) which lies on an outer side of the measured linear tapering section and has a film thickness that is decreased in a curved manner (see FIG. 6).

Note that the film thickness of the luminescent layer 23R in the measured linear tapering section is equivalent to the film thickness of the luminescent layer 23R in the theoretical tapering section, and can be theoretically calculated.

However, unlike the film thickness of the luminescent layer 23R in the theoretical tapering section, it is difficult to theoretically calculate the film thickness of the luminescent layer 23R in the measured curved tapering section. Various factors are possible for forming the measured curved tapering section, and a main factor may be scattering of the vapor deposition particles themselves.

According to the verification by the inventors, assuming that a film thickness of the luminescent layer 23R in the theoretical flat section is 100%, a film thickness of the luminescent layer 23R in the boundary between the measured linear tapering section and the measured curved tapering section is 2% (i.e., 1/50 of the film thickness of the luminescent layer 23R in the theoretical flat section). Further, in a case where a region between (i) the boundary between the measured linear tapering section and the measured curved tapering section and (ii) a part of the measured curved tapering section in which part a film thickness is 1% is defined as a peripheral region, a width Wu of the peripheral region in the plan view was found to be 3 µm to 5 µm (i.e., 3 µm≤Wu≤5 µm). Further, the peripheral region was found to be formed to reach an outer side of the theoretical tapering section.

The following description will discuss, based on a shape of the luminescent layer 23R, details of a preferable method for forming the luminescent layer 23R of the present embodiment, from the viewpoint of color mixture in adjacent sub-pixels and light-emitting characteristic of the subject sub-pixel.

The following describes a method for forming the luminescent layer 23R in order to prevent deterioration in display quality caused by color mixture in the sub-pixels 2G and 2B adjacent to the sub-pixel 2R in which the luminescent layer 23R is formed.

As above described, a sub-pixel in which color mixture is caused has a problem that light having an intended wavelength is not emitted or light is not emitted.

Such deterioration in display quality is caused due to color mixture in the pixel opening 16R of the sub-pixel 2R. Meanwhile, in the non-display region 15R, display quality is not deteriorated even when color mixture is caused.

In other words, display quality is deteriorated in a case where color mixture is caused in an exposed part of the first electrode 21, whereas display quality is not deteriorated in a case where color mixture is caused above the edge cover 15.

Moreover, the inventors found that, assuming that a film thickness of the luminescent layers 23G and 23B in the pixel openings 16G and 16B is 100% and in a case where color mixture is caused in the pixel openings 16G and 16B by mixture of the luminescent layer 23R having a different color, the color mixture does not significantly influence a light-emitting characteristic, provided that the film thickness of the luminescent layer 23R is 1% or less of the film thickness of the luminescent layers 23G and 23B.

On the basis of the above description, the following description will discuss a method for forming the luminescent layer 23R without causing deterioration in display quality.

Figure 7:
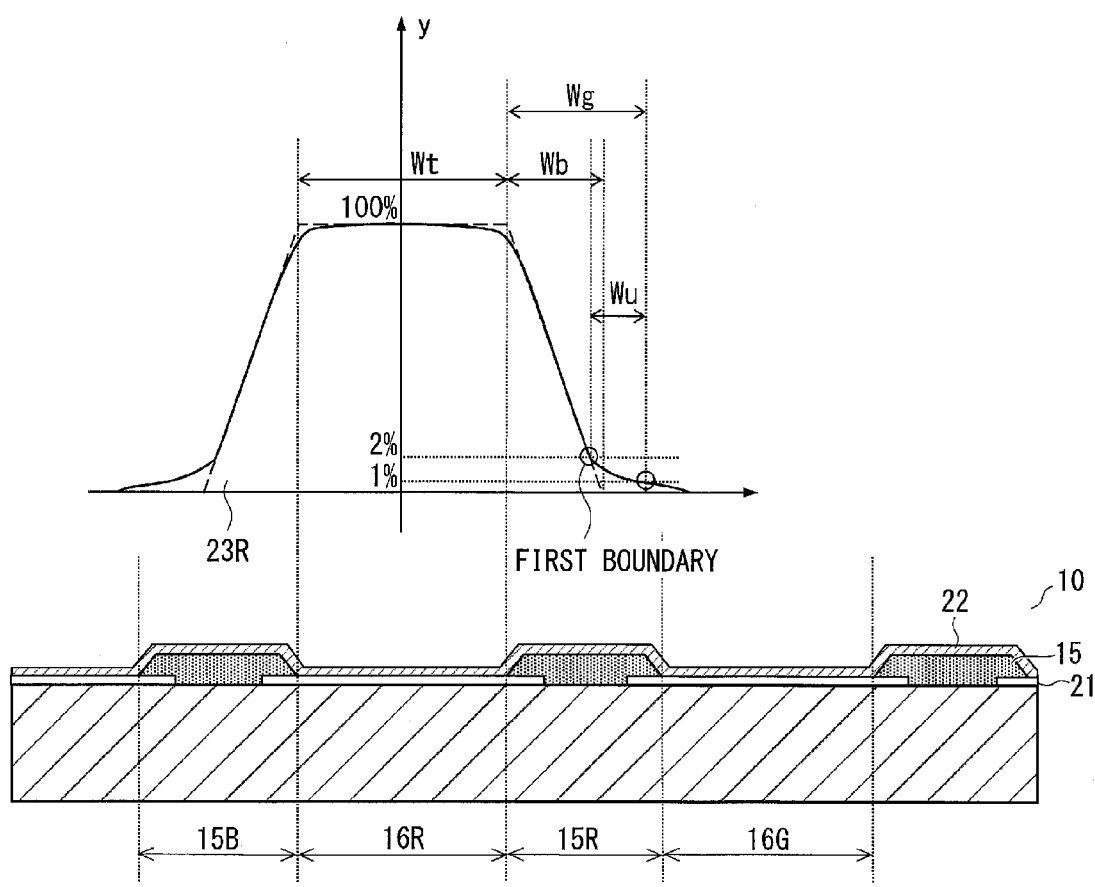
FIG. 7 is a cross-sectional view illustrating the TFT substrate and the luminescent layer in the organic EL display device of Embodiment 1.

FIG. 7 is a cross-sectional view illustrating the TFT substrate and the luminescent layer, which has been formed on the TFT substrate by the luminescent layer depositing step, in the organic EL display device of the present embodiment. FIG. 7 is a cross-sectional view taken along the line A-A of FIG. 2. Note that, in FIG. 7, a detailed configuration of the TFT substrate 10 is omitted. Moreover, for explanation, the TFT substrate 10 and the luminescent layer 23R formed on the TFT substrate 10 are depicted as being apart from each other.

In a case where the luminescent layers 23R, 23G, and 23B having equivalent film thicknesses are formed in the respective pixel openings 16R, 16G, and 16B of the sub-pixels 2R, 2G, and 2B, the film thicknesses of the luminescent layers 23R, 23G, and 23B of the organic EL display device 1 of the present embodiment are controlled as follows.

That is, as illustrated in FIG. 7, in the plan view, a shortest distance between (i) a boundary (first boundary) between a measured linear tapering section and a measured curved tapering section of the luminescent layer 23R (first luminescent layer) formed for the pixel opening 16R (first pixel opening) and (ii) a pixel opening 16G (second pixel opening) of the sub-pixel 2G adjacent to the sub-pixel 2R is 3 µm or more, more preferably 5 µm or more.

Here, as above described, the width Wu of the peripheral region in the plan view is 3 µm to 5 µm (i.e., 3 µm≤Wu≤5 µm).

Therefore, a part of the luminescent layer 23R which part is formed in the pixel opening 16G is outside of the peripheral region, and a film thickness of the part is 1% or less of the film thickness of the luminescent layer 23R in the theoretical flat section.

Moreover, assuming that the film thickness of the luminescent layer 23G is equivalent to that of the luminescent layer 23R, the part of the luminescent layer 23R which part is formed in the pixel opening 16G has the film thickness that is 1% or less of the film thickness of the luminescent layer 23G in the theoretical flat section.

The film thickness of the part of the luminescent layer 23R which part is formed in the pixel opening 16G is 1% or less of the film thickness of the flat section of the luminescent layer 23G (second luminescent layer, not illustrated), and therefore normal green light is emitted from the luminescent layer 23G in the pixel opening 16G and thus the light-emitting characteristic in the pixel opening 16G is not influenced.

The following description will discuss a method for forming the luminescent layer 23R in order to obtain a light-emitting characteristic preferable for the sub-pixel 2R.

The light-emitting characteristic of the luminescent layer 23R greatly depends on the film thickness. In order to obtain a uniform light-emitting characteristic in the pixel opening 16R, the film thickness of the luminescent layer 23R in the pixel opening 16R is preferably uniform.

Therefore, in a case where the luminescent layer 23R is formed on the TFT substrate 10 as illustrated in FIG. 7, the luminescent layer 23R is preferably formed so that the pixel opening 16R is covered with the theoretical flat section of the luminescent layer 23R.

For example, the luminescent layer 23R is formed in the pixel opening 16R on the TFT substrate 10 so that a boundary between the theoretical flat section and the theoretical tapering section overlaps with an end part of the pixel opening 16R in the plan view.

From this, the film thickness of the luminescent layer 23R in the pixel opening 16R becomes substantially constant, and therefore the light-emitting characteristic in the sub-pixel 2R becomes substantially uniform.

By thus forming the luminescent layer 23R while taking into consideration color mixture in the adjacent sub-pixels and the light-emitting characteristic in the subject sub-pixel, it is possible to (i) prevent deterioration in display quality caused by color mixture in the pixel openings 16G and 16B and (ii) obtain the uniform light-emitting characteristic in the sub-pixel 2R.

The following description will discuss, from the viewpoint of color mixture in the adjacent sub-pixels and the light-emitting characteristic in the subject sub-pixel, details of design of the vapor deposition device 70 and the pixel openings 16R, 16G, and 16B for forming the luminescent layer 23R in the luminescent layer depositing step included in the process of manufacturing the organic EL display device of the present embodiment.

The following description will discuss design of the vapor deposition device 70 and the pixel openings 16R, 16G, and 16B for preventing deterioration in display quality caused by color mixture in the adjacent sub-pixels 2G and 2B when the luminescent layer 23R is formed.

Figure 8:
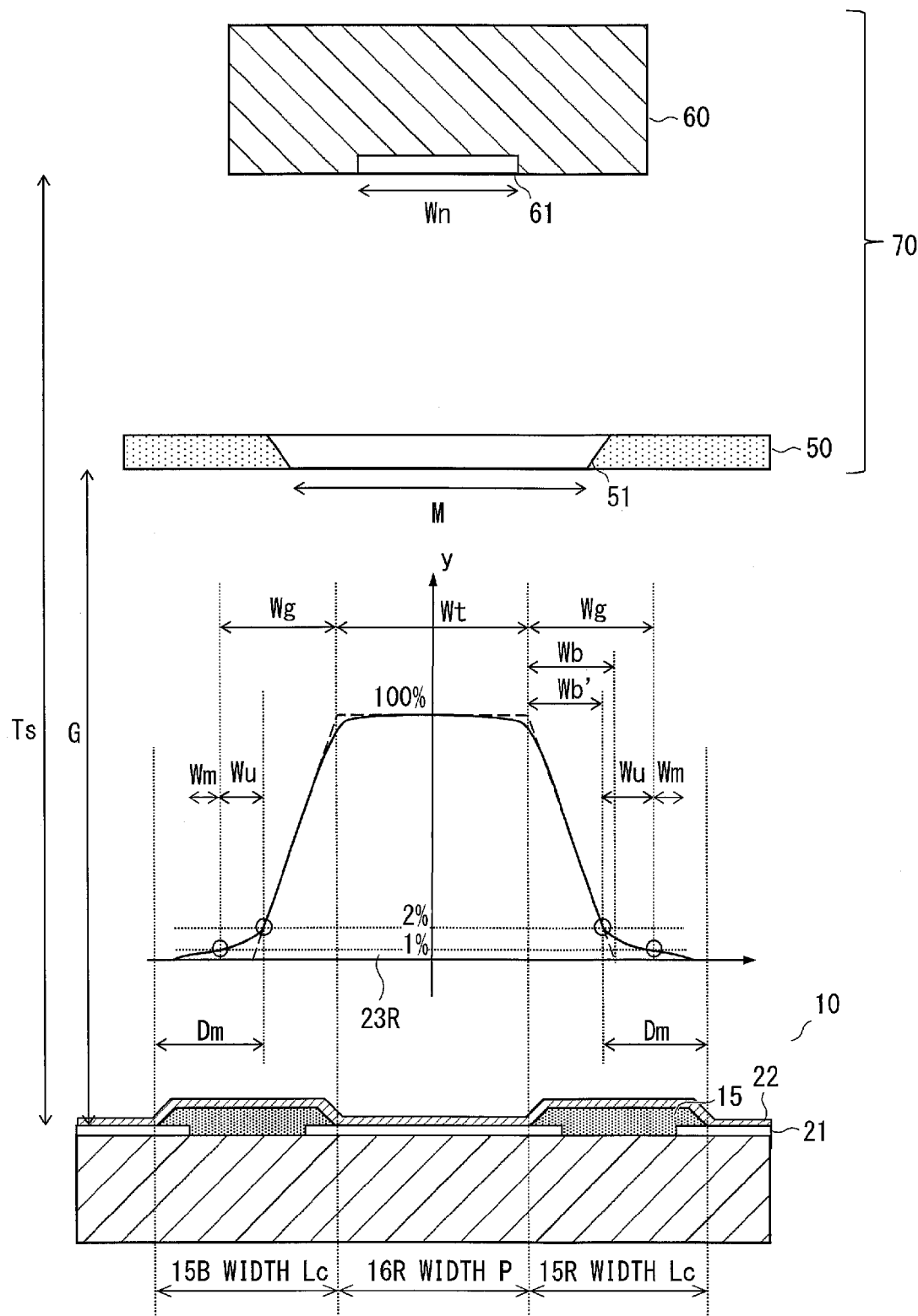
FIG. 8 is a cross-sectional view illustrating a TFT substrate, a luminescent layer, and a vapor deposition device, for explaining a luminescent layer depositing step.

FIG. 8 is a cross-sectional view of the TFT substrate, the luminescent layer, and the vapor deposition device, for explaining the luminescent layer depositing step of the present embodiment. FIG. 8 corresponds to a cross-sectional view of the TFT substrate 10 and the luminescent layer 23R taken along the line A-A of FIG. 2.

As illustrated in FIG. 8, in the luminescent layer depositing step, the TFT substrate 10, the vapor deposition mask 50, and the vapor deposition source 60 are aligned so that a center of the pixel opening, a center of the mask opening 51, and a center of the vapor deposition source opening 61 are arranged on one straight line.

Here, a width of each of the pixel openings 16R, 16G, and 16B (i.e., a width of an exposed part of the first electrode 21) is assumed to be "P", and a width of each of the non-display regions 15R, 15G, and 15B (i.e., a width of the edge cover 15) is assumed to be "Lc".

In the luminescent layer depositing step, the width P of the pixel opening and the width Lc of the non-display region need to fall within the range below so that the part of the luminescent layer 23R which part is formed in each of the pixel openings 16G and 16B has the film thickness that is 1% or less of the film thickness of the flat section of the luminescent layer 23R.

$$P + 2Lc \geq Wt + 2Wg \quad \text{Formula (1)}$$

Here, a width Wg is a width, in the plan view, of a part which (i) is included in the tapering region of the luminescent layer and (ii) has a film thickness of 1 μm or more.

Moreover, as illustrated in FIG. 8, assuming that a width in the plan view of a part which (i) is included in the tapering region of the luminescent layer and (ii) has a film thickness that is 2% or more of that of the theoretical flat section is Wb', the width Wg is represented by the following formula:

$$Wg = Wb' + Wu$$

In this case, a triangular shape whose base has a width of Wb and whose oblique side is the measured tapering section of the luminescent layer is similar to a triangular shape whose base has a width of Wb' and whose oblique side is a part of the measured tapering section of the luminescent layer.

A ratio between Wb and Wb' is obtained based on a height ratio of these two triangular shapes.

$$Wb : Wb' = 1 : 0.98$$

that is, $$Wb' = 0.98 Wb$$

From this, Wg is represented as follows by the use of the width Wb of the theoretical tapering section and the width Wu of the peripheral region.

$$Wg = 0.98 Wb + Wu$$

Therefore, from the formula (1), a relation of the width P of the pixel opening, the width Lc of the non-display region, the width Wt of the theoretical flat section, and the width Wb of the theoretical tapering section needs to satisfy the following formula:

$$P + 2Lc \geq Wt + 1.96 Wb + 2Wu \quad \text{Formula (2)}$$

Moreover, as above described, the width Wt of the theoretical flat section and the width Wb of the theoretical tapering section are represented as follows:

$$Wt = \{(Ts \times M)/(Ts - G)\} - Wb$$

$$Wb = \{(G \times Wn)/(Ts - G)\}$$

Therefore, the formula (2) can be represented as follows:

$$P + 2Lc \geq \{(Ts \times M + 0.96 \times G \times Wn)/(Ts - G)\} + 2Wu \quad \text{Formula (3)}$$

Here, the width P of the pixel opening, the width Lc of the non-display region, the width M of the mask opening 51, the distance Ts between the vapor deposition source 60 and the TFT substrate 10, the distance G between the vapor deposition mask 50 and the TFT substrate 10, and the width Wn of the vapor deposition source opening 61 are design parameters in the luminescent layer depositing step, and can be controlled by changing a vapor deposition condition. Meanwhile, it is difficult to control the width Wu of the peripheral region by changing the vapor deposition condition.

Moreover, as above described, the peripheral region spreads in the outer side of the theoretical tapering section.

In view of this, the vapor deposition method of the present embodiment is characterized in designing the vapor deposition device 70 and the TFT substrate 10 in consideration of the fact that the peripheral region is formed.

Specifically, by taking into consideration the fact that the peripheral region is formed, the vapor deposition condition is determined so that P, Lc, M, Ts, G, and Wn satisfy the following formula:

$$P + 2Lc = \{(Ts \times M + 0.96 \times G \times Wn)/(Ts - G)\} + 2Dm \quad \text{formula (4)}$$

where "Dm" is a design margin secured in consideration of the fact that the peripheral region is formed, and is a shortest distance in the plan view between the first boundary and a pixel opening of the adjacent pixel.

Therefore, in a case where $$Dm \geq Wu$$

is satisfied, the luminescent layer of the peripheral region does not reach the pixel opening of the adjacent pixel, and it is therefore possible to prevent deterioration in display quality caused by color mixture.

As above described, the width Wu of the peripheral region is represented as follows:

$$3 \text{ μm} \leq Wu \leq 5 \text{ μm},$$

therefore, in a case where the following formula is satisfied:

$$3 \text{ μm} \leq Dm \quad \text{Formula (5)},$$

it is possible to (i) inhibit the luminescent layer of the peripheral region from reaching the pixel opening of the adjacent pixel and (ii) inhibit deterioration in display quality caused by color mixture. Moreover, in a case where the following formula is satisfied:

$$5 \mu m \leq Dm \quad \text{Formula (6),}$$

it is possible to more surely (i) inhibit the luminescent layer of the peripheral region from reaching the pixel opening of the adjacent pixel and (ii) inhibit deterioration in display quality caused by color mixture.

Here, in a normal luminescent layer depositing step, it is preferable to provide a certain vapor deposition margin in the vapor deposition condition, by taking into consideration alignment of the vapor deposition device 70, dimensional accuracy of the vapor deposition mask 50, and dimensional accuracy of the TFT substrate 10.

In view of this, as illustrated in FIG. 8, a design margin Dm preferably satisfies the following by taking into consideration a vapor deposition margin Wm:

$$Dm \geq Wu + Wm$$

That is, the design margin Dm satisfies:

$$3 \mu m + Wm \leq Dm \quad \text{Formula (7)}$$

or $$5 \mu m + Wm \leq Dm \quad \text{Formula (8)}$$

Specifically, it is preferable to design the design margin Dm by taking into consideration the vapor deposition margin Wm of 5 μm to 20 μm.

It is possible to form the luminescent layer 23R without causing deterioration in display quality due to color mixture, by designing, in the luminescent layer depositing step of forming a luminescent layer on a TFT substrate having a pixel opening with a width P, (i) arrangement of the vapor deposition source 60, the vapor deposition mask 50, and the TFT substrate 10, (ii) the width M of the mask opening 51, and (iii) the width Wn of the vapor deposition source opening 61 such that any of the formula (4) and the formulae (5) through (8) is satisfied.

In other words, in a case where the first pixel opening having the width P and the non-display region having the width Lc are defined on the TFT substrate 10, the width M of the mask opening, the width Wn of the injection hole, the distance G between the substrate and the vapor deposition mask, and the distance Ts between the substrate and the vapor deposition source can be set for forming the luminescent layer 23R without causing deterioration in display quality due to color mixture.

Note that, in the normal luminescent layer depositing step, Ts>>G is satisfied, and therefore Wt and Wb are approximated as follows:

$$Wt = M - Wb$$

$$Wb = (G/Wn) \times Ts$$

and the formula (4) can be represented as follows:

$$P + 2Lc = M + \{(0.96 \times G \times Wn)/Ts\} + 2Dm \quad (9)$$

For example, the following discusses a case where the vapor deposition condition is determined so as to satisfy the formula (9) and the formula (5). The formula (9) can be transformed as follows:

$$[P + 2Lc - M - \{(0.96 \times G \times Wn)/Ts\}]/2 = Dm$$

and, in a case where the formula (5) is substituted into the above formula, the following formula is obtained:

$$[P + 2Lc - M - \{(0.96 \times G \times Wn)/Ts\}]/2 \geq 3 \mu m$$

From above, it is possible to establish, without trial experiment such as vapor deposition, a process that prevents color mixture in a very short time by determining parameters (G, Ts, M) of the vapor deposition device 70 from P and Lc, which are design values of the TFT substrate 10, such that the above formula is satisfied.

Note that, in a case where the vapor deposition margin Wm is taken into consideration, the vapor deposition condition can be determined so that the formula (9) and the formula (7) are satisfied. That is, the following formula is satisfied:

$$[P + 2Lc - M - \{(0.96 \times G \times Wn)/Ts\} - Wm]/2 \geq 3 \mu m$$

The following description will discuss designing of the vapor deposition device 70 and the pixel openings 16R, 16G, and 16B for obtaining a uniform light-emitting characteristic in the sub-pixel 2R.

In order to obtain the uniform light-emitting characteristic in the sub-pixel 2R, the pixel opening 16R is preferably covered with the theoretical flat section of the luminescent layer 23R. In a case where the luminescent layer 23R is formed so that the pixel opening 16R is covered with the theoretical flat section of the luminescent layer 23R, the width P of each of the pixel openings 16R, 16G, and 16B is represented as follows:

$$P \leq Wt,$$

that is, $$P \leq \{(Ts \times M) - (G \times Wn)/(Ts - G)\} \quad \text{Formula (10)}$$

In order to increase an aperture ratio of the display device, the width P of each of the pixel openings 16R, 16G, and 16B is preferably large. Therefore, it is more preferable to satisfy the following formula:

$$P = \{(Ts \times M) - (G \times Wn)/(Ts - G)\} \quad \text{Formula (11)}$$

In a case where (i) the arrangement of the vapor deposition source 60, the vapor deposition mask 50, and the TFT substrate 10, (ii) the width M of the mask opening 51, and (iii) the width Wn of the vapor deposition source opening 61 are designed so that the formula (11) is satisfied in the luminescent layer depositing step of forming the luminescent layer on the TFT substrate including the pixel openings having the width P, it is possible to form the luminescent layer 23R while obtaining a uniform light-emitting characteristic in the sub-pixel 2R with a maximum aperture ratio.

Figure 9:
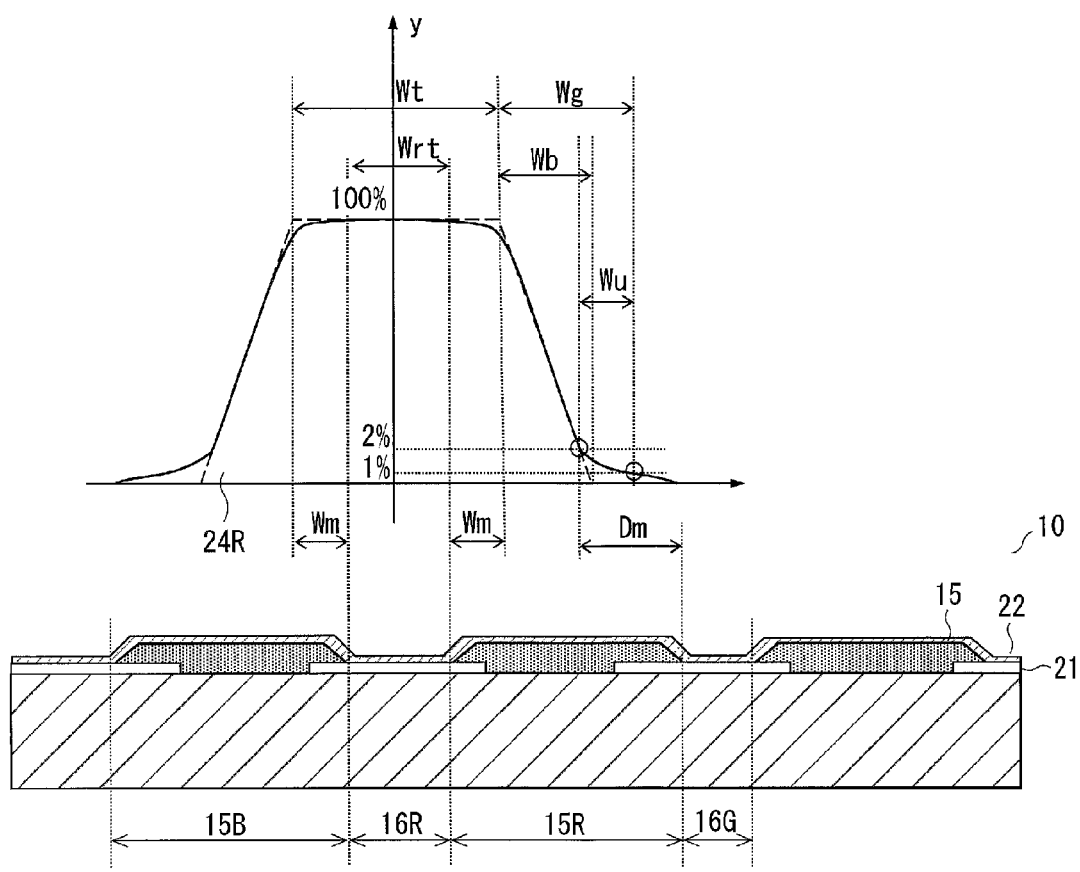
FIG. 9 is another cross-sectional view illustrating the TFT substrate and the luminescent layer in the organic EL display device of Embodiment 1.

FIG. 9 is a cross-sectional view illustrating another example of the TFT substrate and the luminescent layer, which has been formed on the TFT substrate by the luminescent layer depositing step, in the present embodiment. FIG. 9 corresponds to a cross-sectional view taken along the line A-A of FIG. 2.

As above described, the vapor deposition margin Wm is provided in the luminescent layer depositing step, and therefore the luminescent layers 23R, 23G, and 23B vary in shape.

Moreover, as above described, the measured film thickness of the luminescent layer 23R shows that the boundary between the measured flat section and the measured tapering section has a gentle round shape, and the width Wrt of the measured flat section is smaller than the width Wt of the theoretical flat section in the plan view, and therefore the measured flat section is within the theoretical flat section.

In order to form the luminescent layer 24R so that the pixel opening 16R is covered with the measured flat section of the luminescent layer, it is possible to provide a margin which is indicated as the width Wm in FIG. 9 in designing the luminescent layer, by taking into consideration the variation caused in the luminescent layer depositing step and the region of the measured flat section.

That is, as illustrated in FIG. 9, a part of the theoretical flat section which part has the width Wm from the periphery of the theoretical flat section preferably overlaps with the non-display region in the plan view.

From this, it is possible to form the luminescent layer 24R so that the pixel opening 16R overlaps with the measured flat section of the luminescent layer 23R in the plan view, and this makes it possible to obtain a further uniform film thickness of the luminescent layer 24R in the pixel opening 16R.

The following description will discuss designing of the vapor deposition device 70 and the pixel openings 16R, 16G, and 16B for forming another example of the luminescent layers 24R, 24G, and 24B as illustrated in FIG. 9.

In a case where the luminescent layer 24R is formed so that the pixel opening 16R is covered with the measured flat section of the luminescent layer 24R, the width P of each of the pixel openings 16R, 16G, and 16B is represented as follows:

$$P \leq Wt - 2Wm \qquad \text{Formula (12)},$$

that is, $$P = \{(Ts \times M) - (G \times Wn)/(Ts - G)\} - 2Wm \qquad \text{Formula (13)},$$

preferably, $$P = \{(Ts \times M) - (G \times Wn)/(Ts - G)\} - 2Wm \qquad \text{Formula (14)}$$

In a case where (i) the arrangement of the vapor deposition source 60, the vapor deposition mask 50, and the TFT substrate 10, (ii) the width M of the mask opening 51, and (iii) the width Wn of the vapor deposition source opening 61 are designed so that the formula (14) is satisfied in the luminescent layer depositing step of forming the luminescent layer on the TFT substrate including the pixel openings having the width P, it is possible to form the luminescent layer 23R while obtaining a further uniform light-emitting characteristic in the sub-pixel 2R with a maximum aperture ratio.

Note that, in a case where the vapor deposition margin Wm is considered in the formula (1), the following formula is obtained:

$$P + 2Lc \geq Wt + 2Wg + 2Wm \qquad \text{Formula (15)}$$

In order to obtain a greater pixel aperture ratio, the formula (12) and the formula (15) are preferably represented as follows, respectively:

$$P = Wt - 2Wm \qquad \text{Formula (16)}$$

$$P + 2Lc = Wt + 2Wg + 2Wm \qquad \text{Formula (17)}$$

In a case where Wm is deleted from the formula (16) and the formula (17), the following formula is obtained:

$$P + Lc = Wt + Wg$$

That is, the following formula is obtained:

$$P + Lc = Wt + 0.98Wb + Wu \qquad \text{Formula (18)}$$

Here, from the following formulae $$Wt = \{(Ts \times M)/(Ts - G)\} - Wb$$

$$Wb = \{(G \times Wn)/(Ts - G)\},$$

the formula (18) is represented as follows:

$$P + Lc = \{(Ts \times M - 0.02 \times G \times Wn)/(Ts - G)\} + Wu \qquad \text{Formula (19)}$$

Therefore, the vapor deposition condition can be determined so that P, Lc, M, Ts, G, and Wn satisfy a formula (20) below, by taking into consideration the fact that the peripheral region is formed:

$$P + 2Lc = \{(Ts \times M - 0.02 \times G \times Wn)/(Ts - G)\} + Dm \qquad \text{Formula (20)}$$

Figure 10:
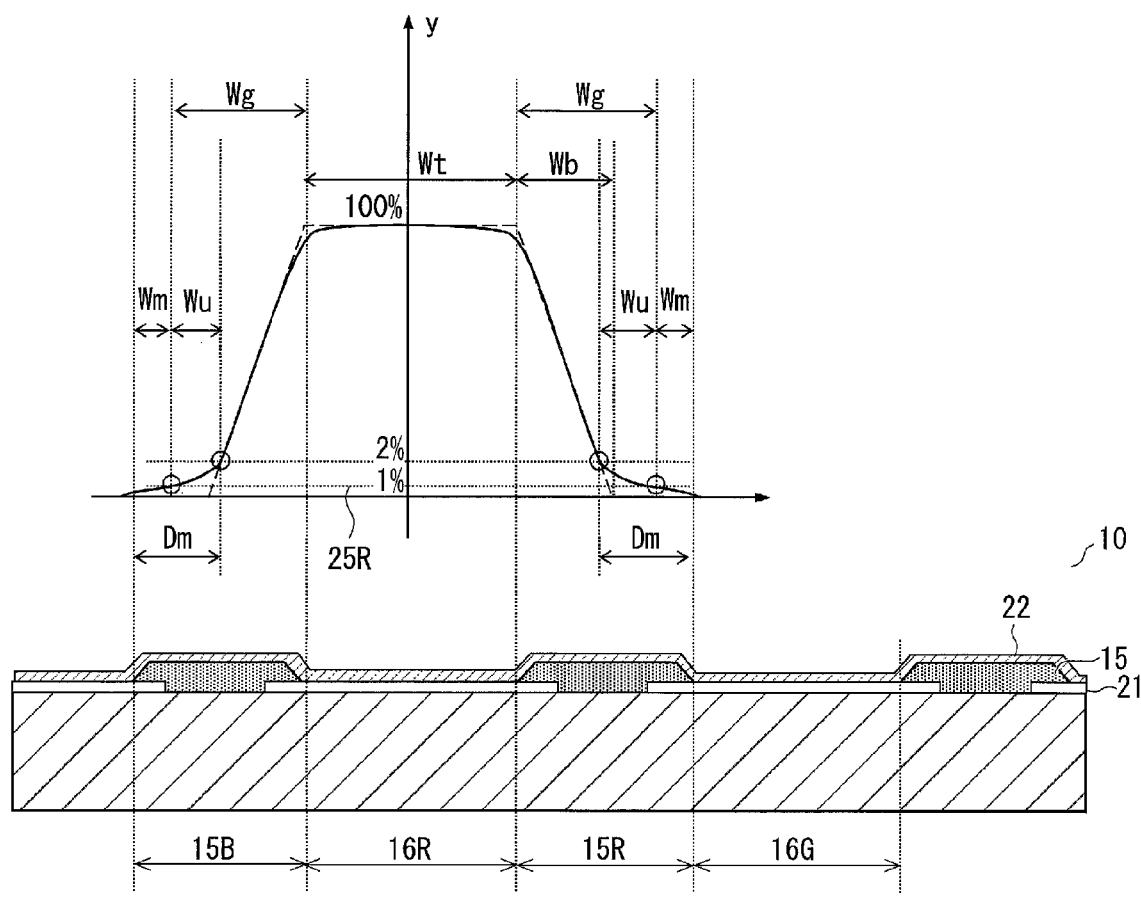
FIG. 10 is a cross-sectional view illustrating a TFT substrate and a luminescent layer in an organic EL display device of Embodiment 2.

The following description will discuss another embodiment of the present invention, with reference to FIG. 10. Note that, for convenience, the same reference numerals are given to members having functions identical to those of the members described in Embodiment 1, and descriptions for such members are omitted.

FIG. 10 is a cross-sectional view illustrating a TFT substrate and a luminescent layer, which has been formed on the TFT substrate by a luminescent layer depositing step, in the present embodiment. FIG. 10 corresponds to a cross-sectional view taken along the line A-A of FIG. 2.

In a case where luminescent layers 25R, 25G, and 25B having equivalent film thicknesses are formed in respective pixel openings 16R, 16G, and 16B of sub-pixels 2R, 2G, and 2B, the film thicknesses of the luminescent layers 25R, 25G, and 25B in an organic EL display device of the present embodiment are controlled as follows.

That is, in the plan view, a shortest distance between (i) a first boundary (not illustrated) between the measured linear tapering section and the measured curved tapering section of the luminescent layer 24R and (ii) the pixel opening 16G of the sub-pixel 2G adjacent to the sub-pixel 2R is 3 μm to 5 μm or 3 μm+Wm to 5 μm+Wm.

Therefore, as with the organic EL display device 1 of Embodiment 1, a part of the luminescent layer 24R which part is formed in the pixel opening 16G (i) lies in an outer side of the peripheral region and (ii) has a film thickness that is 1% or less of the film thickness of the flat section of the luminescent layer 24G. From this, the light-emitting characteristic in the pixel opening 16G is not influenced, and green light is normally emitted from the pixel opening 16G.

Moreover, unlike the organic EL display device 1 of Embodiment 1, in a case where the film thickness of the theoretical flat section is assumed to be 100%, a part of the luminescent layer 24R which part has a film thickness of 1% overlaps, in the plan view, with an end part of the pixel opening 16G of the sub-pixel 2G that is adjacent to the sub-pixel 2R. This makes it possible to reduce a ratio of the non-display regions 15R, 15G, and 15B in an area of the TFT substrate 10, and it is therefore possible to improve the aperture ratio of the organic EL display device.

The following description will discuss designing of the vapor deposition device 70 and the pixel openings 16R, 16G, and 16B for forming the luminescent layer 25R in the luminescent layer depositing step included in the process of manufacturing the organic EL display device of the present embodiment.

In the luminescent layer forming step of the present embodiment, the vapor deposition condition is determined so that the formula (4) (which indicates the relation of the width P of the pixel opening, the width Lc of the non-display region, the width M of the mask opening 51, the distance Ts between the vapor deposition source 60 and the TFT substrate 10, the distance G between the vapor deposition mask 50 and the TFT substrate 10, the width Wn of the vapor deposition source opening 61, and the design margin Dm) satisfies the following formula:

$$3 \text{ μm} \leq Dm \leq 5 \text{ μm} \qquad \text{formula (21)}$$

By thus designing the vapor deposition condition and carrying out the luminescent layer depositing step, it is possible to form the luminescent layer 25R without causing deterioration in display quality due to color mixture.

Here, in the normal luminescent layer depositing step, it is preferable to provide a certain vapor deposition margin in the vapor deposition condition, as above described.

In view of this, it is preferable to design the design margin Dm so that the following formula is satisfied, by taking into consideration the vapor deposition margin Wm:

$$3 \text{ μm}+Wm \leq Dm \leq 5 \text{ μm}+Wm \qquad \text{formula (22)}$$

Figure 11:
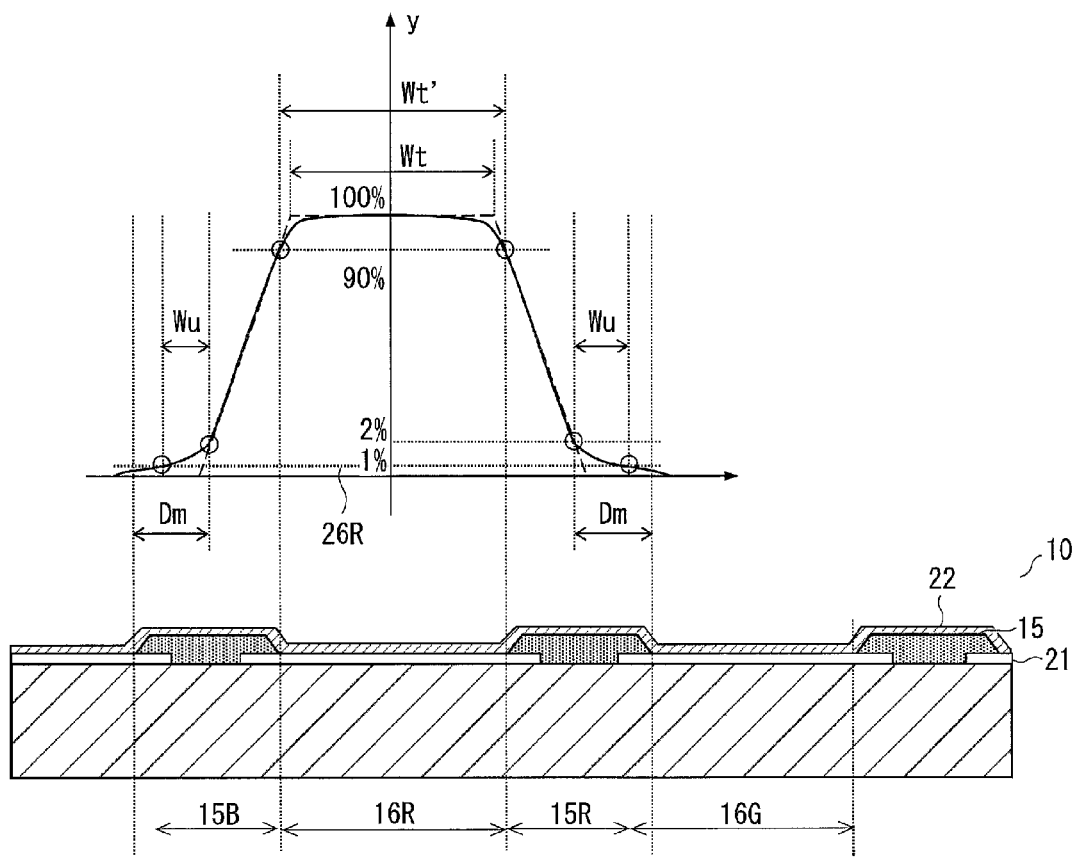
FIG. 11 is a cross-sectional view illustrating a TFT substrate and a luminescent layer in an organic EL display device of Embodiment 3.
Figure 12:
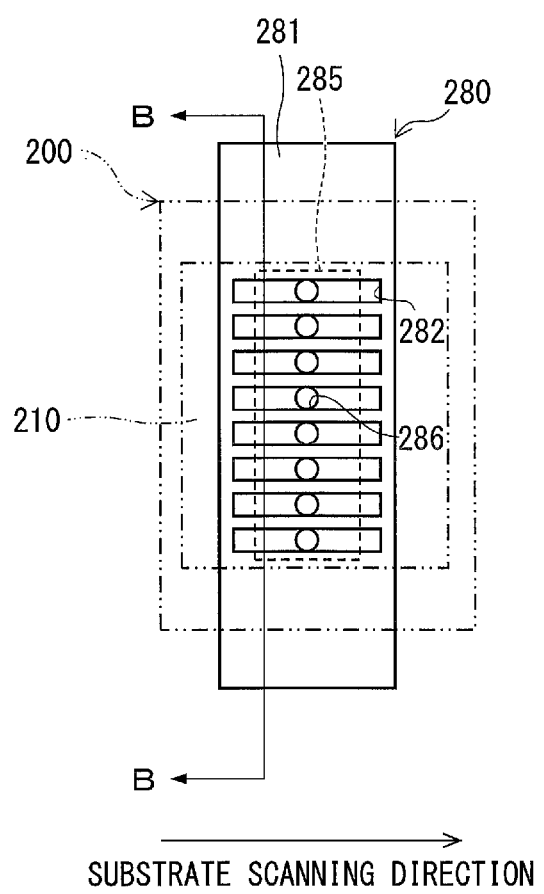
FIG. 12 is a plan view illustrating a film formation target substrate and a mask unit which are provided in a vacuum chamber of a vapor deposition device of Patent Literature 1 as prior art and are viewed from a film formation target substrate side.
Figure 13:
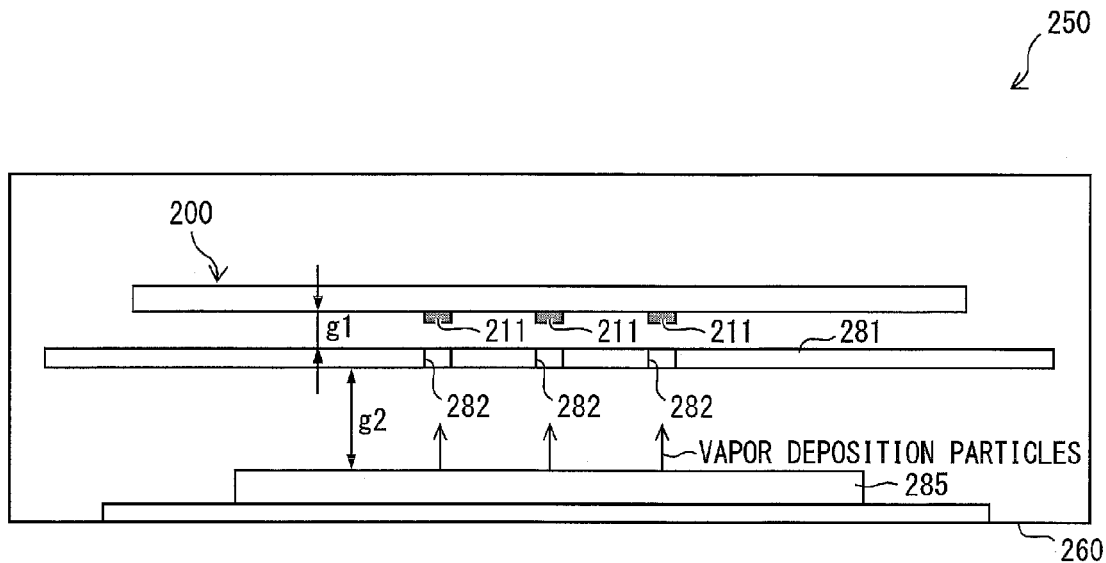
FIG. 13 is a cross-sectional view taken along the line B-B in FIG. 13 and schematically illustrating a configuration of main parts of the vapor deposition device of Patent Literature 1 as prior art.
Figure 14:
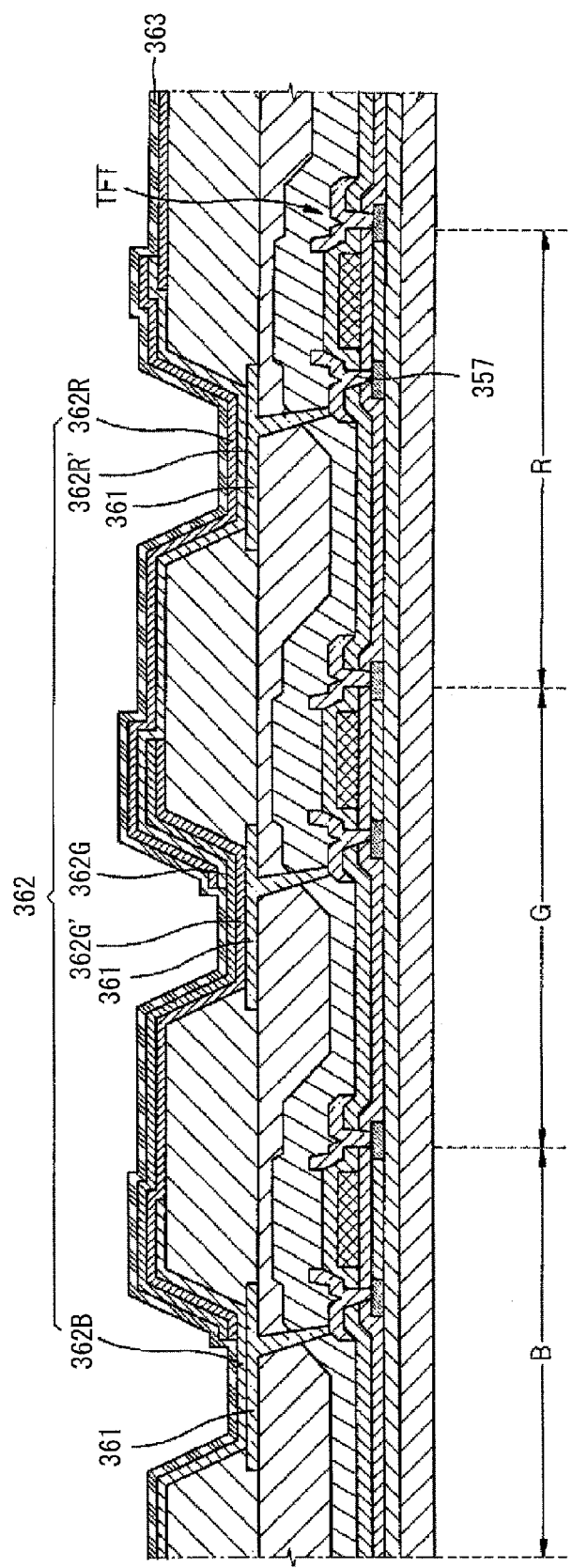
FIG. 14 is a cross-sectional view illustrating one (1) pixel of a light emitting organic display device manufactured by a thin film vapor deposition device of Patent Literature 2 as prior art.

The following description will discuss another embodiment of the present invention, with reference to FIG. 11. Note that, for convenience, the same reference numerals are given to members having functions identical to those of the members described in Embodiments 1 and 2, and descriptions for such members are omitted.

FIG. 11 is a cross-sectional view illustrating a TFT substrate and a luminescent layer, which has been formed on the TFT substrate by a luminescent layer depositing step, in the present embodiment. FIG. 11 corresponds to a cross-sectional view taken along the line A-A of FIG. 2.

According to the organic EL display devices of Embodiments 1 and 2, the luminescent layer is formed so that the pixel opening 16R of the TFT substrate 10 is covered with the theoretical flat section or the measured flat section of the luminescent layer.

Meanwhile, assuming that the film thickness of the theoretical flat section of the luminescent layer 26R is 100% in the organic EL display device of the present embodiment, the pixel opening 16R of the TFT substrate 10 is covered with a part having a film thickness of 90% or more. In other words, assuming that the film thickness of the theoretical flat section of the luminescent layer 26R is 1, the film thickness of the luminescent layer 26R in the end part of the pixel opening 16R is 9/10 or more and less than 1.

Assuming that a maximum value of the film thickness of the luminescent layer in the pixel opening is 100%, in most cases, the light-emitting characteristic in the sub-pixel hardly varies, provided that the film thickness of the luminescent layer formed in the pixel opening is 90% or more.

In view of this, in the organic EL display device of the present embodiment, the luminescent layer 26R is formed so that the pixel opening 16R is covered with a region of the luminescent layer 26R which region has a film thickness of 90% or more.

As illustrated in FIG. 11, a width Wt' of the region of the luminescent layer 26R which region has the film thickness of 90% or more is represented by the following formula, and is larger than the width Wt of the theoretical flat section:

$$Wt'=Wt+2\times 0.1\times Wb$$

By thus enlarging the width of the pixel opening 16R to Wt', it is possible to increase the ratio of the pixel openings 16R, 16G, and 16B in the TFT substrate 10, and accordingly the aperture ratio is further increased.

The following description will discuss designing of the vapor deposition device 70 and the pixel openings 16R, 16G, and 16B for forming the luminescent layer 26R in the luminescent layer depositing step included in the process of manufacturing the organic EL display device of the present embodiment.

In a case where the luminescent layer 2R is formed so that the pixel opening 16R is covered with the part of the luminescent layer 26R which part has the film thickness of 90% or more, the width P of each of the pixel openings 16R, 16G, and 16B is represented as follows:

$$P \leq Wt' \qquad \text{formula (23),}$$

that is, $$P \leq Wt+2\times 0.1\times Wb=\{(Ts\times M)-(0.8\times G\times Wn)\}/(Ts-G) \qquad \text{formula (24)}$$

Moreover, in order to increase the aperture ratio of the display device, the width P of each of the pixel openings 16R, 16G, and 16B is preferably large. In view of this, in a case where:

$$Wt \leq P \leq Wt' \qquad \text{Formula (23'),}$$

that is, $$\{(Ts\times M)-(G\times Wn)/(Ts-G)\} \leq P \leq \{(Ts\times M)-(0.8\times G\times Wn)\}/(Ts-G) \qquad \text{Formula (24')}$$

is satisfied, it is possible to enlarge the width P of the pixel opening, as compared with the luminescent layer depositing step of Embodiment 1.

In particular, it is preferable to satisfy the following formula:

$$P=\{(Ts\times M)-(0.8\times G\times Wn)\}/(Ts-G) \qquad \text{formula (25)}$$

From this, it is possible to form the luminescent layers 26R, 26G, and 26B so that the pixel openings 16R, 16G, and 16B are covered with respective regions of the luminescent layers 26R, 26G, and 26B which regions have film thicknesses of 90% or more.

In a case where (i) the arrangement of the vapor deposition source 60, the vapor deposition mask 50, and the TFT substrate 10, (ii) the width M of the mask opening 51, and (iii) the width Wn of the vapor deposition source opening 61 are designed so that the formula (25) is satisfied in the luminescent layer depositing step of forming the luminescent layer on the TFT substrate including the pixel openings having the width P, it is possible to form the luminescent layer 26R while securing the uniform light-emitting characteristic in the sub-pixel 2R with the maximum aperture ratio.

Moreover, as with the formula (12) in Embodiment 1, the formula (23) is represented as follows by taking into consideration the vapor deposition margin Wm:

$$P \leq Wt'-2Wm \qquad \text{formula (26)}$$

and therefore the formula (25) is represented as follows:

$$P=\{(Ts\times M)-(0.8\times G\times Wn)\}/(Ts-G)-2Wm \qquad \text{formula (27)}$$

The method for manufacturing a display device in accordance with an aspect 1 of the present invention is a method for manufacturing a display device including a substrate (TFT substrate 10) on which a plurality of pixel openings and a non-display region are defined, the plurality of pixel openings being respective regions from which light is emitted, and the non-display region being a region which is located between any adjacent ones of the plurality of pixel openings and from which no light is emitted, a plural kinds of luminescent layers for emitting different colors of lights being provided on the substrate for the respective plurality of pixel openings, the method including the step of: depositing the plural kinds of luminescent layers on the substrate at respective locations corresponding to the plurality of pixel openings by (i) providing the substrate, a vapor deposition mask (50) having a mask opening (51), and a vapor deposition source (60) having an injection hole (vapor deposition source opening 61) from which vapor deposition particles are injected, in this order and (ii) depositing the vapor deposition particles onto the substrate via the mask opening, in a case where the vapor deposition particles are deposited onto the substrate in the luminescent layer depositing step so as to form (i) a first luminescent layer which corresponds to a first pixel opening that is one of the plurality of pixel openings and (ii) a second luminescent layer which (a) corresponds to a second pixel opening that is adjacent to the first pixel opening via the non-display region and (b) emits light whose color is different from a color of light emitted by the first luminescent layer, the following formulae being satisfied: $P+2Lc \geq \{(Ts \times M+0.96 \times G \times Wn)/(Ts-G)\}+2Dm$ and $3 \ \mu m \leq Dm \leq 5 \ \mu m$ where "M" is a width of the mask opening, "Wn" is a width of the injection hole, "G" is a distance between the substrate and the vapor deposition mask, "Ts" is a distance between the substrate and the vapor deposition source, "P" is a width of the first pixel opening, and "Lc" is a width of the non-display region.

In a case where vapor deposition is carried out while a certain gap is provided between the vapor deposition source and the vapor deposition mask, in a conventional method, a first luminescent layer formed in a first pixel opening on a TFT substrate is not flat but spreads in a decrescent manner to a range wider than a width of the first pixel opening. As a result, the first luminescent layer reaches a second pixel opening, and color mixture may be caused in the second pixel opening.

On the other hand, according to the method of the present invention for manufacturing the display device, the luminescent layer depositing step is designed by taking into consideration the film thickness of the luminescent layer in the region in which the luminescent layer spreads in a decrescent manner.

It is therefore possible to prevent deterioration in display quality due to color mixture caused in the second pixel opening by the first luminescent layer.

According to the method for manufacturing the display device in accordance with an aspect 2 of the present invention, it is possible in the aspect 1 that the following formulae are satisfied: $P+2Lc=\{(Ts \times M+0.96 \times G \times Wn)/(Ts-G)\}+2Dm$ and $3 \ \mu m+Wm \leq Dm \leq 5 \ \mu m+Wm$ where "Wm" is a vapor deposition margin in the luminescent layer depositing step.

According to the method for manufacturing the display device in accordance with an aspect 3 of the present invention, it is possible in the aspect 1 or 2 that the substrate, the vapor deposition mask, and the vapor deposition source are aligned so that each of centers of the respective plurality of pixel openings, a center of the mask opening, and a center of the injection hole are arranged on one straight line in a plan view; and in a direction in which the first pixel opening and the second pixel opening are arranged, the following formula is satisfied: $P \leq \{(Ts \times M)-(G \times Wn)\}/(Ts-G)$.

With the above step, it is possible to form, in the first pixel opening, the first luminescent layer having the uniform film thickness. This makes it possible to obtain the first luminescent layer having the uniform light-emitting characteristic in the first pixel opening.

According to the method for manufacturing the display device in accordance with an aspect 4 of the present invention, it is possible in the aspect 1 or 2 that the substrate, the vapor deposition mask, and the vapor deposition source are aligned so that each of centers of the respective plurality of pixel openings, a center of the mask opening, and a center of the injection hole are arranged on one straight line in a plan view; and in a direction in which the first pixel opening and the second pixel opening are arranged, the following formula is satisfied: $\{(Ts \times M)-(G \times Wn)/(Ts-G)\} \leq P \leq \{(Ts \times M)-(0.8 \times G \times Wn)\}/(Ts-G)$.

With the above step, it is possible to form the first luminescent layer in the first pixel opening so as to have the film thickness of 90% or more and 100% or less, relative to a maximum film thickness of the first luminescent layer.

By thus forming the first luminescent layer, the light-emitting characteristic of the first luminescent layer in the first pixel opening does not cause excessive decrease in display quality.

Meanwhile, with the above step, it is possible to obtain a largest first pixel opening within a range that does not cause excessive decrease in display quality. From this, it is possible to increase the aperture ratio of the display device.

According to the method for manufacturing the display device in accordance with an aspect 4 of the present invention, it is possible in the aspect 2 that the substrate, the vapor deposition mask, and the vapor deposition source are aligned so that each of centers of the respective plurality of pixel openings, a center of the mask opening, and a center of the injection hole are arranged on one straight line in a plan view; and in a direction in which the first pixel opening and the second pixel opening are arranged, the following formula is satisfied: $P=\{(Ts \times M)-(0.8 \times G \times Wn)\}/(Ts-G)-2Wm$.

According to the method for manufacturing the display device in accordance with an aspect 6 of the present invention, it is possible in any of the aspects 1 through 5 that, in a direction in which the first pixel opening and the second pixel opening are arranged, the first pixel opening having a width of P and the non-display region having a width of Lc are defined on the substrate; and the width M of the mask opening, the width Wn of the injection hole, the distance G between the substrate and the vapor deposition mask, and the distance Ts between the substrate and the vapor deposition source are set in the luminescent layer depositing step so that the following formulae are satisfied: $P+2Lc \geq \{(Ts \times M+0.96 \times G \times Wn)/(Ts-G)\}+2Wu$ and $3 \ \mu m \leq Wu \leq 5 \ \mu m$, and the vapor deposition particles are deposited onto the substrate.

With the step, it is possible to (i) set the width M of the mask opening, the width Wn of the injection hole, the distance G between the substrate and the vapor deposition mask, the distance Ts between the substrate and the vapor deposition source and (ii) deposit the vapor deposition particles onto the substrate such that deterioration in display quality is prevented which is caused by color mixture due to the first luminescent layer in the second pixel opening.

The present invention is applicable to an organic EL display device in which luminescent layers are provided for respective sub-pixels.

REFERENCE SIGNS LIST

1: Organic EL display device (display device)
10: TFT substrate (substrate)
15R, 15G, and 15B: Non-display region
16R, 16G, and 16B: Pixel opening
23R, 23G, and 23B: Luminescent layer
24R, 24G, and 24B: Luminescent layer
25R, 25G, and 25B: Luminescent layer
26R, 26G, and 26B: Luminescent layer
50: Vapor deposition mask
51: Mask opening
60: Vapor deposition source
61: Vapor deposition source opening (injection hole)

The invention claimed is:

1. A method for manufacturing a display device including a substrate on which a plurality of pixel openings and a non-display region are defined, the plurality of pixel openings being respective regions from which light is emitted, and the non-display region being a region which is located between any adjacent ones of the plurality of pixel openings and from which no light is emitted, a plural kinds of luminescent layers for emitting different colors of lights being provided on the substrate for the respective plurality of pixel openings, said method comprising the step of:

depositing the plural kinds of luminescent layers on the substrate at respective locations corresponding to the plurality of pixel openings by (i) providing the substrate, a vapor deposition mask having a mask opening, and a vapor deposition source having an injection hole from which vapor deposition particles are injected, in this order and (ii) depositing the vapor deposition particles onto the substrate via the mask opening, in a case where the vapor deposition particles are deposited onto the substrate in the luminescent layer depositing step so as to form (i) a first luminescent layer which corresponds to a first pixel opening that is one of the plurality of pixel openings and (ii) a second luminescent layer which (a) corresponds to a second pixel opening that is adjacent to the first pixel opening via the non-display region and (b) emits light whose color is different from a color of light emitted by the first luminescent layer, the following formulae being satisfied:

$$P+2Lc=\{(Ts \times M+0.96 \times G \times Wn)/(Ts-G)\}+2Dm$$

and $$3 \mu m \leq Dm \leq 5 \mu m$$

where "M" is a width of the mask opening, "Wn" is a width of the injection hole, "G" is a distance between the substrate and the vapor deposition mask, "Ts" is a distance between the substrate and the vapor deposition source, "P" is a width of the first pixel opening, and "Lc" is a width of the non-display region.

2. The method as set forth in claim 1, wherein the following formulae are satisfied:

$$P+2Lc=\{(Ts \times M+0.96 \times G \times Wn)/(Ts-G)\}+2Dm$$

and $$3 \mu m + Wm \leq Dm \leq 5 \mu m + Wm$$

where "Wm" is a vapor deposition margin in the luminescent layer depositing step.

3. The method as set forth in claim 1, wherein:
the substrate, the vapor deposition mask, and the vapor deposition source are aligned so that each of centers of the respective plurality of pixel openings, a center of the mask opening, and a center of the injection hole are arranged on one straight line in a plan view; and
in a direction in which the first pixel opening and the second pixel opening are arranged, the following formula is satisfied:

$$P \leq \{(Ts \times M)-(G \times Wn)\}/(Ts-G).$$

4. The method as set forth in claim 1, wherein:
the substrate, the vapor deposition mask, and the vapor deposition source are aligned so that each of centers of the respective plurality of pixel openings, a center of the mask opening, and a center of the injection hole are arranged on one straight line in a plan view; and
in a direction in which the first pixel opening and the second pixel opening are arranged, the following formula is satisfied:

$$\{(Ts \times M)-(G \times Wn)/(Ts-G)\} \leq P \leq \{(Ts \times M)-(0.8 \times G \times Wn)\}/(Ts-G).$$

5. The method as set forth in claim 2, wherein:
the substrate, the vapor deposition mask, and the vapor deposition source are aligned so that each of centers of the respective plurality of pixel openings, a center of the mask opening, and a center of the injection hole are arranged on one straight line in a plan view; and
in a direction in which the first pixel opening and the second pixel opening are arranged, the following formula is satisfied:

$$P=\{(Ts \times M)-(0.8 \times G \times Wn)\}/(Ts-G)-2Wm.$$

6. The method as set forth in claim 1, wherein:
in a direction in which the first pixel opening and the second pixel opening are arranged, the first pixel opening having a width of P and the non-display region having a width of Lc are defined on the substrate; and
the width M of the mask opening, the width Wn of the injection hole, the distance G between the substrate and the vapor deposition mask, and the distance Ts between the substrate and the vapor deposition source are set in the luminescent layer depositing step so that the following formulae are satisfied:

$$P+2Lc=\{(Ts \times M+0.96 \times G \times Wn)/(Ts-G)\}+2Dm$$

and $$3 \mu m \leq Dm \leq 5 \mu m.$$

* * * * *